US006773830B2

(12) United States Patent
Aziz et al.

(10) Patent No.: US 6,773,830 B2
(45) Date of Patent: *Aug. 10, 2004

(54) GREEN ORGANIC LIGHT EMITTING DEVICES

(75) Inventors: Hany Aziz, Burlington (CA); Cuong Vong, Hamilton (CA); Nan-Xing Hu, Oakville (CA); Zoran D. Popovic, Mississauga (CA); Ah-Mee Hor, Mississauga (CA)

(73) Assignee: Xerox Corporation, Stamford, CT (US)

( * ) Notice: Subject to any disclaimer, the term of this patent is extended or adjusted under 35 U.S.C. 154(b) by 226 days.

This patent is subject to a terminal disclaimer.

(21) Appl. No.: 10/005,518

(22) Filed: Nov. 8, 2001

(65) Prior Publication Data

US 2003/0104243 A1 Jun. 5, 2003

(51) Int. Cl.[7] .............................................. H05B 33/14
(52) U.S. Cl. ....................... 428/690; 428/213; 428/332; 428/917; 313/504; 313/506
(58) Field of Search ................................ 428/690, 917, 428/213, 332; 313/504, 506

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 5,061,569 A | 10/1991 | VanSlyke et al. | 428/457 |
| 5,141,671 A | 8/1992 | Bryan et al. | 252/301.16 |
| 5,150,006 A | 9/1992 | Van Slyke et al. | 313/504 |
| 5,151,629 A | 9/1992 | VanSlyke et al. | 313/504 |
| 5,227,252 A | 7/1993 | Murayama et al. | 428/690 |
| 5,458,977 A * | 10/1995 | Hosokawa et al. | 428/411.1 |
| 5,516,577 A | 5/1996 | Matsuura et al. | 428/212 |
| 5,601,903 A | 2/1997 | Fujii et al. | 428/212 |
| 5,639,914 A * | 6/1997 | Tomiyama et al. | 564/309 |
| 5,739,635 A | 4/1998 | Wakimoto | 313/504 |
| 5,792,557 A * | 8/1998 | Nakaya et al. | 428/411.1 |
| 5,834,894 A | 11/1998 | Shirasaki et al. | 313/509 |
| 5,846,666 A | 12/1998 | Hu et al. | 428/690 |
| 5,853,905 A | 12/1998 | So et al. | 428/690 |
| 5,925,472 A | 7/1999 | Hu et al. | 428/690 |
| 5,925,980 A | 7/1999 | So et al. | 313/504 |
| 5,935,720 A | 8/1999 | Chen et al. | 428/690 |
| 5,942,340 A | 8/1999 | Hu et al. | 428/690 |
| 5,952,115 A | 9/1999 | Hu et al. | 428/690 |
| 6,020,078 A | 2/2000 | Chen et al. | 428/690 |
| 6,057,048 A | 5/2000 | Hu et al. | 428/690 |
| 6,114,055 A | 9/2000 | Choong et al. | 428/690 |
| 6,130,001 A | 10/2000 | Shi et al. | 428/690 |
| 6,229,012 B1 | 5/2001 | Hu et al. | 544/180 |
| 6,565,996 B2 * | 5/2003 | Hatwar et al. | 428/690 |
| 2001/0053462 A1 * | 12/2001 | Mishima | 428/690 |
| 2002/0034659 A1 * | 3/2002 | Nishi et al. | 428/690 |
| 2003/0068524 A1 * | 4/2003 | Hatwar et al. | 428/690 |

FOREIGN PATENT DOCUMENTS

| | | |
|---|---|---|
| EP | 0 903 964 A1 | 3/1999 |
| WO | WO 99 20081 A | 4/1999 |

OTHER PUBLICATIONS

Chen et al., "Efficient green organic light–emitting diodes with stericly hindered coumarin dopants", Applied Physics Letters, vol. 79, No. 22, Nov. 26, 2001, pp. 3711–3713.*

Shi J. et al., "Doped Organic Electroluminescent Devices with Improved Stability", *Applied Physics Letter*, American Institute of Physics, vol. 70, no 13, Mar. 31, 1997, pp. 1665 to 1667.

Copending application Ser. No. 09/357,551, (now U.S. patent No. 6,392,339) filed Jul. 20, 1999, on "Organic Light Emitting Devices Having Improved Efficiency and Operation Lifetime" by Hany Aziz et al.

Copending application Ser. No. 09/606,670, (now U.S. patent No. 6,392,250) filed Jun. 30, 2000, on "Organic Light Emitting Devices Having Improved Performance" by Hany Aziz et al.

Copending application U.S. Ser. No. 09/800,716, filed Mar. 8, 2001, on "Cathodes for Electroluminescent Devices Having Improved Contrast and Reduced Dark Spot Growth" by Yoon–Fei Liew et al.

Copending application Ser. No. 09/770,159, filed Jan. 26, 2001, on "Organic Light Emitting Devices " by Hany Aziz et al.

Copending application Ser. No. 09/770,154, filed Jan. 26, 2001, on "Electroluminescent Devices" by Hany Aziz et al.

Copending application Ser. No. 09/935,031, filed Aug. 22, 2001, on "OLEDS Having Light Absorbing Electrode" by Hany Aziz et al.

S.A. Van Slyke et al., "Organic Electroluminescent Devices with Improved Stability", Appl. Phys. Lett. 69, pp. 2160–2162, 1996.

Kido et al., "Organic Electroluminescent Devices Based on Molecularly Doped Polymers", *Appl. Phys. Lett.* 61, pp. 761–763, 1992.

S. Naka et al., "Organic Electroluminescent Devices Using a Mixed Single Layer," *Jpn. J. Appl. Phys.* 33, pp. L1772–L1774, 1994.

W. Wen et al., *Appl. Phys. Lett.* 71, 1302 (1997).

C. Wu et al., "Efficient Organic Electroluminescent Devices Using Single–Layer Doped Polymer Thin Films with Bipolar Carrier Transport Abilities", *IEEE Transactions on Electron Devices 44*, pp. 1269–1281, 1997.

(List continued on next page.)

*Primary Examiner*—Cynthia H. Kelly
*Assistant Examiner*—Dawn Garrett
(74) *Attorney, Agent, or Firm*—E. D. Palazzo

(57) ABSTRACT

A device containing a number of layers with one of the layers containing a green emitting component.

42 Claims, 1 Drawing Sheet

OTHER PUBLICATIONS

H. Aziz et al., *Science* 283, 1900 (1999).

Z.D. Popovic et al., *Proceedings of the SPIE*, vol. 3176, "Organic Light–Emitting Materials and Devices II", San Diego, CA, Jul. 21–23, 1998, pp. 68 to 73.

Y. Hamada et al., "Influence of the Emission Site on the Running Durability of Organic Electroluminescent Devices", *Jpn. J. Appl. Phys.* 34, pp. L824–L826, 1995.

Zhou et al., "Real–Time Observation of Temperature Rise and Thermal Breakdown Processes in Organic Leds Using an IR Imaging And Analysis System", *Advanced Materials* 12, pp 265–269, 2000.

J.R. Sheats et al., "Organic Electroluminescent Devices", *Science* 273, pp. 884–888, 1996.

S. Tokito et al., "High–Temperature Operation of an Electroluminescent Device Fabricated Using a Novel Triphenylamine Derivative", *Appl. Phys. Lett.* 69, 878 (1996).

J. Shi and C.W. Tang in "Doped organic electroluminescent devices with improved stability", *Appl. Phys. Lett.* 70, pp. 1665–1667, 1997.

* cited by examiner

GREEN ORGANIC LIGHT EMITTING DEVICES

COPENDING APPLICATIONS

Illustrated in copending application U.S. Ser. No. 10/005, 930, filed concurrently herewith, the disclosure at which is totally incorporated herein by reference, is an organic light emitting device comprising (i) a first electrode;

(ii) a mixed region comprising a first hole transport material and a first electron transport material;

(iii) a second electrode;

(iv) an optional thermal protective layer coated on one of the first and second electrodes, wherein one of the first and second electrodes is a hole injection anode, and one of the electrodes is an electron injection cathode, and wherein the organic light emitting device further comprises at least one of (v) a hole transport region interposed between said anode and said mixed region; and wherein the hole transport region is comprised of a second hole transport material, and which material is in contact with the mixed region; and (vi) an electron transport region interposed between the cathode and said mixed region, and wherein said region is comprised of a second electron material, and which material is in contact with the mixed region; and containing at least one of a. said hole transport region (v) wherein said first hole transport material (ii) is similar to or dissimilar than said second hole transport material (v);

b. said electron transport region (vi) wherein said first electron transport material (ii) is similar to or dissimilar than said second electron transport material (vi); and wherein when a. is similar, b. is dissimilar; when a. is dissimilar, b. is similar or dissimilar; and when b. is dissimilar, a. is similar or dissimilar.

Illustrated in copending application U.S. Ser. No. 10/005, 404 filed concurrently herewith, the disclosure of which is totally incorporated herein by reference, is an organic light emitting device comprising (i) a first electrode;

(ii) a region comprising a mixture of (1) a tertiary aromatic amine, (2) a metal oxinoid, and (3) a red emitting material represented by

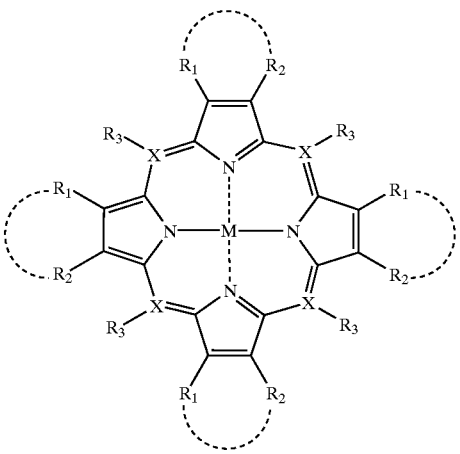

wherein X is a carbon C atom or a nitrogen N atom, or optionally oxygen or sulfur; $R_1$, $R_2$ and $R_3$ are each independently selected from the group consisting of hydrogen, alkyl, substituted alkyl, aryl, and substituted aryl; M is a divalent, trivalent or tetravalent metal;

(iii) a second electrode;

(iv) an optional protective element coated on at least one of the first and second electrodes; wherein one of said first and second electrodes is a hole injection anode, and one of said electrodes is an electron injection cathode; and at least one of (v) a hole transport region situated between the anode and the region (ii), and wherein the hole transport region optionally includes a buffer layer; and (vi) an electron transport region situated between the cathode and the region (ii), and wherein said red emitting component is present in an amount of from 1 to about 40 weight percent based on total weights of components in region (ii).

Illustrated in copending application U.S. Ser. No. 10/005, 970, filed concurrently herewith, the disclosure of which is totally incorporated herein by reference, is an organic light emitting device comprising (i) an anode;

(ii) a hole transport layer comprising a mixture of a porphyrin and a hole transport material;

(iii) a mixed region comprising a mixture of (1) a hole transport material, and (2) an electron transport material, and which mixed region optionally contains an organic luminescent material;

(iv) a cathode; and wherein the organic light emitting device optionally further comprises at least one of (v) an electron transport region interposed between the mixed region and the cathode; and (vi) an optional thermal protective element coated on one of the anode and cathode.

Illustrated in copending application U.S. Ser. No. 10/005, 993, filed concurrently herewith, the disclosure of which is totally incorporated herein by reference, is an organic light emitting device, comprising (i) a first electrode;
(ii) a region comprising a mixture of (1) N,N'-bis(p-biphenyl)-N,N'-diphenyl benzidine, and (2) an electron transport material, and which region further optionally comprises an organic luminescent material, and wherein said mixed region is capable of emitting light in response to hole-electron recombination;
(iii) a second electrode;
(iv) an optional thermal layer coated on at least one of the first and second electrodes, wherein one of said first and second electrodes is a hole injection anode, and one of said electrodes is an electron injection cathode, and wherein the organic light emitting device further comprises at least one of
(v) a hole transport region interposed or situated between the first electrode and the mixed region; and
(vi) an electron transport region interposed or situated between the mixed region and the cathode.

Illustrated in copending application U.S. Ser. No. 09/935,031, filed Aug. 22, 2001 on "OLEDs Having Light Absorbing Electrode", the disclosure of which is totally incorporated herein by reference, is an organic light emitting device comprising a first electrode;
a second electrode; and
a luminescent region including an organic electroluminescent material between the first electrode and the second electrode, wherein one of the first electrode and the second electrode includes both a substantially transparent charge injecting layer adjacent to the luminescent region and an electrically conductive light absorbing layer.

Illustrated in U.S. Pat. No. 6,392,339 on "Organic Light Emitting Devices Having Improved Efficiency and Operation Lifetime", filed on Jul. 20, 1999, the disclosure of which is totally incorporated herein by reference, is an organic light emitting device, comprising, for example, a mixed region comprising a mixture of a hole transport material and an electron transport material, one of the hole transport material and the electron transport material being an emitter, the mixed region having a first surface and a second surface;
at least one of (i) a hole transport material on the first surface, and (ii) an electron transport material on the second surface;
an anode in contact with the hole transport material on the first surface or with the first surface; and
a cathode in contact with the electron transport material on the second surface or with the second surface; and U.S. Pat. No. 6,392,250 on "Organic Light Emitting Devices Having Improved Performance", filed on Jun. 30, 2000, the disclosure of which is totally incorporated herein by reference, is an organic light emitting device, comprising, for example,
a mixed region having a first surface and a second surface, the mixed region comprising a mixture of a hole transport material, an electron transport material and at least one dopant, the dopant being an emitter, at least one of the hole transport material and the electron transport material optionally being an emitter;
at least one of (i) a hole transport region on the first surface, and (ii) an electron transport region on the second surface;
an anode in contact with the hole transport region on the first surface or with the first surface; and
a cathode in contact with the electron transport region on the second surface or with the second surface.

Illustrated in copending applications U.S. Ser. No. 09/770,159 on "Organic Light Emitting Devices", filed Jan. 26, 2001, the disclosure of which is totally incorporated herein by reference, is an organic light emitting device comprising, for example, in an optional sequence (i) a substrate;
(ii) a first electrode;
(iii) a mixed region comprising a mixture of a hole transport material and an electron transport material, and wherein this mixed region includes at least one organic luminescent material;
(iv) a second electrode;
(v) a thermal protective element coated on the second electrode, wherein one of the two said first and second electrodes is a hole injection anode, and one of the two said electrodes is an electron injection cathode, and wherein the organic light emitting device further comprises;
(vi) a hole transport region, interposed between the anode and the mixed region, wherein the hole transport region optionally includes a buffer layer; and
(vii) an electron transport region interposed between the second electrode and the mixed region; and in U.S. Ser. No. 09/770,154 on "Electronluminescent Devices", filed on Jan. 26, 2001, the disclosure of which is totally incorporated herein by reference, is disclosed an organic light emitting device comprising in sequence
a substrate;
a first electrode;
a light emitting region comprising an organic luminescent material; and
a second electrode, and a thermal protective element.

Illustrated in now abandoned application U.S. Ser. No. 09/800,716 on "Cathodes For Electroluminescent Devices Having Improved Contrast and Reduced Dark Spot Growth", filed on Mar. 8, 2001, the disclosure of which is totally incorporated herein by reference, is an electroluminescent device, comprising:

a first electrode;
a second electrode; and
a luminescent region between the first electrode and the second electrode, wherein one of the first electrode and the second electrode comprises a metal-organic mixed region including:
a metal;
an organic material; and
at least one component selected from the group consisting of metals, organic materials and inorganic materials.

The appropriate components and processes of the above copending applications may be selected for embodiments of the present invention in embodiments thereof.

BACKGROUND

The present invention relates to optoelectronic devices and, more particularly, to organic light emitting devices (organic EL devices). More specifically, the present invention relates to substantially stable organic EL devices, and which devices do not in embodiments, for example, degrade in the form of undergoing a rapid decrease in their efficiency at high temperatures, such as about 100° C., and moreover, which devices are not substantially adversely affected by high temperatures.

REFERENCES

An organic electroluminescent (EL) device can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent layer and undergo recombination to form excitonic states which subsequently emit light. A number of organic EL devices have been prepared from a laminate of an organic luminescent material and electrodes of opposite polarity, which devices include a single crystal material, such as single crystal anthracene as the luminescent substance as described, for example, in U.S. Pat. No. 3,530,325, the disclosure of which is totally incorporated herein by reference. These types of devices are believed to require excitation voltages on the order of 100 volts or greater.

An organic EL device with a multilayer structure can be formed as a dual layer structure comprising one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507; 4,720,432, and 4,769,292, the disclosures of which are totally incorporated herein by reference, wherein U.S. Pat. No. 4,769,292, the disclosure of which is totally incorporated herein by reference, discloses, for example, an organic EL device comprising three separate layers, a hole transport layer, a luminescent layer, and an electron transport layer, which layers are laminated in sequence and are sandwiched between an anode and a cathode, and wherein a fluorescent dopant material is added to the emission zone or layer whereby the recombination of charges results in the excitation of the fluorescent material. In some of these multilayer structures, such as, for example, organic light emitting devices described in U.S. Pat. No. 4,720,432, the disclosure of which is totally incorporated herein by reference, the organic light emitting device further comprises a buffer layer interposed between the hole transport layer and the anode. The combination of the hole transport layer and the buffer layer forms a dual-layer hole transport region, reference S. A. Van Slyke et al., "Organic Electroluminescent Devices with Improved Stability," *Appl. Phys. Lett.* 69, pp. 2160–2162, 1996, the disclosure of which is totally incorporated herein by reference.

There have also been attempts to obtain electroluminescence from organic light emitting devices containing mixed layers, for example, layers in which both the hole transport material and the emitting electron transport material are mixed together in one single layer, see, for example, Kido et al., "Organic Electroluminescent Devices Based On Molecularly Doped Polymers," *Appl. Phys. Lett.* 61, pp. 761–763, 1992; S. Naka et al., "Organic Electroluminescent Devices Using a Mixed Single Layer," *Jpn. J. Appl. Phys.* 33, pp. L1772–L1774, 1994; W. Wen et al., *Appl. Phys. Lett.* 71, 1302 (1997); and C. Wu et al., "Efficient Organic Electroluminescent Devices Using Single-Layer Doped Polymer Thin Films with Bipolar Carrier Transport Abilities", *IEEE Transactions on Electron Devices* 44, pp. 1269–1281, 1997. In a number of these devices, the electron transport material and the emitting material can be the same or the mixed layer can further comprise an emitting material as a dopant. Other examples of organic light emitting devices which are formed of a single organic layer comprising a hole transport material and an electron transport material can be found, for example, in U.S. Pat. Nos. 5,853,905; 5,925,980; 6,114,055 and 6,130,001, the disclosures of which are totally incorporated herein by reference. As indicated in the article by S. Naka et al., these single mixed layer organic light emitting devices are generally less efficient than multilayer organic light emitting devices. These devices, which include only a single mixed layer of a hole transport material, such as NBP (N,N'-di(naphthalene-1-yl)-N,N'-diphenyl-benzidine), and an emitting electron transport material, such as $Alq_3$ (tris (8-hydroxyquinoline) aluminum), are believed to be unstable and to have poor efficiency. The instability of these devices is believed to be caused by the direct contact between the electron transport material in the mixed layer and the hole injecting contact comprised of indium tin oxide (ITO), which results in the formation of an unstable cationic electronic transport material, and the instability of the mixed layer/cathode interface, see H. Aziz et al., *Science* 283, 1900 (1999), the disclosure of which is totally incorporated herein by reference. In addition, the single mixed layer may result in high leakage currents and hence poor efficiency, see Z. D. Popovic et al., *Proceedings of the SPIE,* Vol. 3176, "Organic Light-Emitting Materials and Devices II", San Diego, Calif., Jul. 21–23, 1998, pp. 68 to 73, the disclosure of which is totally incorporated herein by reference.

While recent progress in organic EL research has elevated the potential of organic EL devices for widespread applications, the operational stability of current available devices may in some instances be below expectations. A number of known organic light emitting devices have relatively short operational lifetimes before their luminance drops to some percentage of its initial value. Providing interface layers as described, for example, in S. A. Van Slyke et al., "Organic Electroluminescent Devices with Improved Stability," *Appl. Phys. Lett.* 69, pp. 2160–2162, 1996, and doping as described, for example, in Y. Hamada et al., "Influence of the Emission Site on the Running Durability of Organic Electroluminescent Devices", *Jpn. J. Appl. Phys.* 34, pp. L824–L826, 1995, may perhaps increase the operational lifetime of organic light emitting devices for room temperature operation, however, the effectiveness of these organic light emitting devices deteriorates for high temperature device operation. In general, the device lifetime can be reduced by a factor of about two for each 10° C. increment in the operational temperature. Moreover, at high temperatures, the susceptibility of the organic light emitting devices to degrade is increased as described, for example, in Zhou et al., "Real-Time Observation of Temperature Rise and Thermal Breakdown Processes in Organic Leds Using an IR Imaging And Analysis System", *Advanced Materials* 12, pp 265–269, 2000, which further reduces the stability of the devices. As a result, the operational lifetime of these organic light emitting devices at a normal display luminance level of about 100 cd/m$^2$ is limited, for example, to about a hundred hours or less at temperatures of about 60° C. to about 80° C., reference J. R. Sheats et al., "Organic Electroluminescent Devices", *Science* 273, pp. 884–888, 1996, and also S. Tokito et al., "High-Temperature Operation of an Electroluminescent Device Fabricated Using a Novel Triphenylamine Derivative", *Appl. Phys. Lett.* 69, 878 (1996).

SUMMARY

Aspects of the present invention relate to an organic light emitting device comprising (i) a first electrode;

(ii) a mixed region comprising a mixture of (1) a tertiary aromatic amine, (2) a metal oxinoid, and (3) a green emitting coumarin dye of the Formula

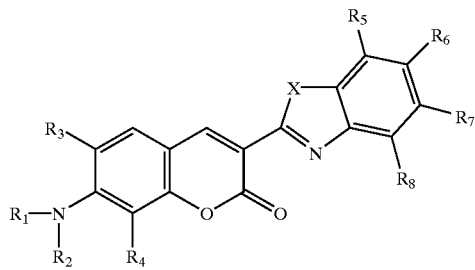

wherein X is selected from the group consisting of an oxygen atom, a sulfur atom, an alkyl imino group and aryl imino group; $R_1$ and $R_2$ are individually selected from the group consisting of alkyl, aryl, and carbocyclic; $R_3$ and $R_4$ are individually selected from the group consisting of a hydrogen atom, alkyl, and optionally a branched or unbranched 5 or 6 member substituent ring connecting with $R_1$ and $R_2$, respectively; and $R_5$, $R_6$, $R_7$, and $R_8$ are individually selected from the group consisting of a hydrogen atom, an alkoxy group and an alkyl group;

(iii) a second electrode;

(iv) an optional thermal protective element coated on one of the first and second electrodes, wherein one of the first and second electrodes is a hole injecting anode, and one of the first and second electrodes is an electron injecting cathode, and wherein the organic light emitting device further comprises at least one of (v) a hole transport region interposed or situated between the anode and the mixed region, wherein the hole transport region optionally includes a buffer layer; and (vi) an electron transport region interposed between the cathode and the mixed region, and wherein the green emitting dye is present in an amount of from about 0.01 to about 10 weight percent based on the total of the mixed layer components (ii); an organic light emitting device wherein the green emitting coumarin dye is 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T); an organic light emitting device wherein the tertiary aromatic amine is a N,N,N',N'-tetraaryl benzidine; an organic light emitting device wherein the amine is an N,N,N',N'-tetraaryl benzidine selected from the group consisting of N,N'-di(naphthalene-1-yl)-N,N'-diphenyl-benzidine (NPB) and N,N'-bis(p-biphenyl)-N,N'-diphenyl benzidine (biphenyl TPD), and the metal oxinoid is tris(8-hydroxyquinoline)aluminum (Alq$_3$); an organic light emitting device wherein the hole transport region comprises at least one material selected from the group consisting of tertiary aromatic amines, porphyrins, and indolocarbazoles; and (ii) the electron transport region comprises at least one material selected from the group consisting of metal oxinoids, stilbenes, triazines, porphyrins, and quinolines; an organic light emitting device wherein the mixed region comprises from about 20 weight percent to about 80 weight percent of a tertiary aromatic amine; from about 80 weight percent to about 20 weight percent of the metal oxinoid; and from about 0.01 weight percent to about 10 weight percent of the coumarin dye, and wherein the weight percents are based on the total weight of materials comprising the mixed region; an organic light emitting device wherein the mixed region comprises from about 35 weight percent to about 65 weight percent of the tertiary aromatic amine; from about 65 weight percent to about 35 weight percent of the metal oxinoid; and from about 0.1 weight percent to about 4 weight percent of the coumarin dye, and wherein the weight percents are based on the total weight of materials comprising the mixed region; an organic light emitting device wherein the mixed region comprises from about 0.2 weight percent to about 2 weight percent of the coumarin dye, and wherein the weight percentages are based on the total weight of materials comprising the mixed region; an organic light emitting device wherein at least one of A. the material comprising the hole transport region and the tertiary aromatic amine comprising the mixed region are similar, and B. the material comprising the electron transport region and the metal oxinoid comprising the mixed region are similar; an organic light emitting device wherein at least one of A. the material comprising the hole transport region and the tertiary aromatic amine comprising the mixed region are different materials, and B. the material comprising the electron transport region and the metal oxinoid comprising the mixed region are different materials; an organic light emitting device wherein there is an electron transport region, and wherein the electron transport region comprises at least two layers; an organic light emitting device wherein (1) a first layer of the electron transport region is contacting the mixed region, and which first layer comprises a material selected from the group consisting of metal oxinoids and quinolines; and (2) a second layer of the electron transport region is contacting the cathode, and which second layer comprises a material selected from the group consisting of metal oxinoids, phthalocyanines, and triazines; an organic light emitting device wherein the first layer comprises a metal oxinoid comprising tris(8-hydroxyquinoline)aluminum (Alq$_3$) or bis(8-hydroxyquinolato)-(4-phenylphenolato)aluminum (Balq), or a quinoline of 1,4-bis(4-phenylquinolin-2-yl)benzene, 4,4'-bis(4-phenylquinolin-2-yl)-1,1'-biphenyl (TA); and the second layer comprises a metal oxinoid of tris(8-hydroxyquinoline)aluminum (Alq$_3$) or bis(8-hydroxyquinolato)-(4-phenylphenolato)

aluminum (Balq); a phthalocyanine of copper phthalocyanine (CuPc); or a triazine of 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine; an organic light emitting device wherein there is a hole transport region, and wherein the hole transport region comprises at least two layers; an organic light emitting device wherein (1) a first layer of the hole transport region is contacting the anode, and which first layer comprises a porphyrin; and (2) a second layer of the hole transport region is contacting the mixed region, and which second layer comprises a material selected from the group consisting of tertiary aromatic amines and indolocarbazoles; an organic light emitting device wherein the first layer comprises copper phthalocyanine; and the second layer comprises a tertiary aromatic amine of N,N'-di(naphthalene-1-yl)-N,N'-diphenyl-benzidine (NPB) or N,N'-bis(p-biphenyl)-N,N'-diphenyl benzidine (biphenyl TPD); or an indolocarbazole comprising 5,11-di-naphthyl-5,11-dihydroindolo[3,2-b]carbazole, or 2,8-dimethyl-5,11-di-naphthyl-5,11-dihydroindolo[3,2-b]carbazole; an organic light emitting device wherein there is present a hole transport region, and wherein the hole transport region comprises a layer comprised of a mixture of (i) from about 25 weight percent to about 99 weight percent of a porphyrin; and (ii) from about 75 weight percent to about 1 weight percent of an aromatic tertiary amine; an organic light emitting device wherein there is at least one of (1) an anode comprising a layer of indium-tin-oxide, and (2) a cathode comprising a layer selected from the group consisting of (i) Mg and Ag; (ii) Al; (iii) indium-tin-oxide; and (iv) an organic compound, Mg and Ag; an organic light emitting device wherein the cathode further comprises an alkaline metal or a compound thereof; an organic light emitting device wherein the alkaline metal is selected from the group consisting of Li, Na, K and Cs; an organic light emitting device wherein there is a thermal protective element, or layer present, and which thermal protective element comprises a layer of SiO, $SiO_2$ or mixtures thereof; an organic light emitting device wherein the mixed region has a thickness of from about 5 nanometers to about 500 nanometers; the hole transport region has a thickness of from about 5 nanometers to about 250 nanometers; and/or the electron transport region has a thickness of from about 5 nanometers to about 100 nanometers; an organic light emitting device comprising (i) an anode of indium-tin-oxide with thickness of from about 30 to about 300 nanometers coated on a substrate, the anode and the substrate being capable of transmitting at least about 70 percent of radiation of wavelength longer than about 400 nanometers;

(ii) a hole transport region on the anode comprised of at least one material selected from the group of materials including copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;

(iii) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris (8-hydroxyquinoline) aluminum or bis(8-hydroxyquinolato)-(4-phenylphenolato)aluminum; and (3) from about 0.2 weight percent to about 2 weight percent of 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T), wherein all weight percents are based on the total weight of materials comprising the mixed region, and wherein the thickness of the mixed region is from about 50 nanometers to about 150 nanometers;

(iv) an electron transport region situated on the mixed region comprised of tris(8-hydroxyquinoline) aluminum ($Alq_3$) or bis(8-hydroxyquinolato)-(4-phenylphenolato)aluminum (Balq), wherein the thickness of the electron transport region is from about 5 nanometers to about 50 nanometers;

(v) a cathode situated on the electron transport region comprised of one of (1) a layer comprised of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag and from about 55 volume percent to about 40 volume percent of $Alq_3$, wherein the thickness of the first layer is from about 100 nanometers to about 600 nanometers, and coated with a second layer of thickness from about 50 nanometers to about 500 nanometers and comprising a metal or a metal alloy; and (vi) a thermal protective element situated on the cathode comprised of SiO, $SiO_2$ or mixtures thereof of a thickness of from about 100 nanometers to about 1,000 nanometers; an organic light emitting device comprising (i) an anode of indium-tin-oxide with thickness of from about 30 to about 300 nanometers coated on a substrate, the anode and the substrate being capable of transmitting at least 70 percent of radiation of wavelength longer than 400 nanometers;

(ii) a hole transport region on or in contact with the anode comprised of at least one material selected from the group of materials including N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo [3,2-b]carbazole; and which region further comprises a buffer layer contacting the anode, and comprised of copper phthalocyanine wherein the thickness of the buffer layer is from about 10 nanometers to about 30 nanometers, and the thickness of the hole transport region is from about 5 nanometers to about 20 nanometers greater than the thickness of the buffer layer;

(iii) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris (8-hydroxyquinoline) aluminum or bis(8- hydroxyquinolato)-(4-phenylphenolato)aluminum; and
(3) from about 0.2 weight percent to about 2 weight percent of 10-2-(benzothiazolyl)-2,3,6,7-tetrahydro-1, 1,7,7-tetramethyl-1H, 5H, 11H-(1)benzopyropyrano (6,7,-8-ij) quinolizin-11-one (C545T), wherein all weight percents are based on the total weight of materials comprising the mixed region, and wherein the thickness of the mixed region is from about 50 nanometers to about 150 nanometers;

(iv) an electron transport region situated on the mixed region comprised of tris(8-hydroxyquinoline) aluminum ($Alq_3$) or bis(8-hydroxyquinolato)-(4-phenylphenolato)aluminum (Balq), wherein the thickness of the electron transport region is from about 5 nanometers to about 50 nanometers;

(v) a cathode situated on the electron transport region comprised of one of (1) a layer comprised of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag and from about 55 volume percent to about 40 volume percent of $Alq_3$, wherein the thickness of the first layer is from about 100 nanometers to about 600 nanometers; and coated with a second layer of a thickness from about 50 nanometers to about 500 nanometers comprising a metal or a metal alloy; and (vi) an optional thermal protective element situated on the cathode comprised of SiO, $SiO_2$ or mixtures thereof of a thickness of from about 100 nanometers to about 1,000 nanometers; an organic light emitting device and comprising (i) an anode of indium-tin-oxide with a thickness of from about 30 to about 300 nanometers coated on a substrate, the anode and the substrate being capable of transmitting at least 70 percent of radiation of wavelength longer than 400 nanometers;

(ii) a hole transport region on the anode comprised of at least one material selected from the group of materials consisting of copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;

(iii) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris (8-hydroxyquinoline) aluminum or bis(8-hydroxyquinolato)-(4-phenylphenolato)aluminum; and (3) from about 0.2 weight percent to about 2 weight percent of 10-2-(benzothiazolyl)-2,3,6,7-tetrahydro-1, 1,7,7-tetramethyl-1H, 5H, 11H-(1)benzopyropyrano (6,7,-8-ij) quinolizin-11-one (C545T), wherein all weight percents are based on the total weight of materials comprising the mixed region, and wherein the thickness of the mixed region is from about 50 nanometers to about 150 nanometers;

(iv) an electron transport region situated on the mixed region comprising (1) a first layer of a thickness of from about 5 nanometers to about 25 nanometers contacting the mixed region, wherein this first layer is comprised of tris(8-hydroxyquinoline)aluminum ($Alq_3$), bis(8-hydroxyquinolato)-(4-phenylphenolato)aluminum (Balq), or 1,4-bis(4-phenylquinolin-2-yl)benzene, 4,4'-bis(4-phenylquinolin-2-yl)-1,1'-biphenyl (TA); and (2) a second layer of a thickness of from about 5 nanometers to about 25 nanometers contacting the cathode, wherein the second is comprised of tris(8-hydroxyquinoline)aluminum ($Alq_3$), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine;

(v) a cathode situated on the electron transport region comprised of one of (1) a layer comprised of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag and from about 55 volume percent to about 40 volume percent of $Alq_3$, wherein the thickness of the first layer is from about 100 nanometers to about 600 nanometers; and coated with a second layer of a thickness of from about 50 nanometers to about 500 nanometers comprising a metal or a metal alloy; and (vi) a thermal protective element situated on the cathode comprised of SiO, $SiO_2$ or mixtures thereof of a thickness of from about 100 nanometers to about 1,000 nanometers; an organic light emitting device comprising (i) an anode of indium-tin-oxide with a thickness of from about 30 to about 300 nanometers coated on a substrate, the anode and the substrate being capable of transmitting at least 70 percent of radiation of wavelength longer than 400 nanometers;

(ii) a hole transport region on the anode comprised of a material selected from the group of materials including N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 8-dimethyl-5,11-di-naphthyl-5,11-dihydroindolo[3,2-b]carbazole; and which region further comprises a buffer layer contacting the anode and comprised of copper phthalocyanine, wherein the thickness of the buffer layer is from about 10 nanometers to about 30 nanometers, and the thickness of the hole transport region is from about 5 nanometers to about 20 nanometers greater than the thickness of the buffer layer;

(iii) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris (8-hydroxyquinoline) aluminum or bis(8-hydroxyquinolato)-(4-phenylphenolato)aluminum; and (3) from about 0.2 weight percent to about 2 weight percent of 10-2-(benzothiazolyl)-2,3,6,7-tetrahydro-1, 1,7,7-tetramethyl-1H, 5H, 11H-(1)benzopyropyrano (6,7,-8-ij) quinolizin-11-one (C545T), wherein all weight percents are based on the total weight of materials comprising the mixed region, and wherein the thickness of the mixed region is from about 50 nanometers to about 150 nanometers;

(iv) an electron transport region situated on the mixed region comprising (1) a first layer of a thickness of from about 5 nanometers to about 25 nanometers contacting the mixed region, wherein this first layer is comprised of tris(8-hydroxyquinoline)aluminum ($Alq_3$), bis(8-hydroxyquinolato)-(4-phenylphenolato)aluminum (Balq), 1,4-bis(4-phenylquinolin-2-yl)benzene, or 4,4-bis(4-phenylquinolin-2-yl)-1,1'-biphenyl (TA); and (2) a second layer of a thickness of from about 5 nanometers to about 25 nanometers contacting the cathode, wherein the second is comprised of tris(8-hydroxyquinoline)aluminum ($Alq_3$), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine;

(v) a cathode situated on the electron transport region comprised of one of (1) a layer comprising of Mg:Ag alloy or Al of a thickness of from about 50 nanometers to about 500 nanometers; and (2) a first layer comprised of from about 40 volume percent to about 55 volume percent of Mg; from about 2 volume percent to about 10 volume percent of Ag and from about 55 volume percent to about 40 volume percent of $Alq_3$, wherein the thickness of the first layer is from about 100 nanometers to about 600 nanometers, and coated with a second layer of a thickness of from about 50 nanometers to about 500 nanometers comprising a metal or a metal alloy; and (vi) an optional thermal protective element situated on the cathode comprised of SiO, $SiO_2$ or mixtures thereof of a thickness of from about 100 nanometers to about 1,000 nanometers; an organic light emitting device wherein X is oxygen or sulfur; an organic light emitting device wherein X is an alkyl amino group wherein alkyl contains from about 1 to about 20 carbon atoms; an organic light emitting device wherein X is an aryl imino group wherein aryl contains from about 6 to about 36 carbon atoms; an organic light emitting device wherein $R_1$ and $R_2$ alkyl contain from about 1 to about 20 carbon atoms, and $R_1$ and $R_2$ aryl contain from about 6 to about 36 carbon atoms; an organic light emitting device wherein $R_3$ and $R_4$ alkyl contain from about 1 to about 20 carbon atoms; an organic light emitting device wherein $R_5$, $R_6$, $R_7$ and $R_8$ alkoxy contain from about 1 to about 20 carbon atoms, and alkyl contains from about 1 to about 20 carbon atoms; an organic light emitting device wherein the protective layer is comprised of a silicon dioxide or a silicon oxide; an organic light emitting device wherein the hole transport region is present; the electron transport region is present; or the hole transport region and the electron transport region are present; an organic light emitting device wherein the regions comprise from about 1 to about 20 layers; an organic light emitting device wherein the regions comprise from about 1 to about 5 layers; an organic light emitting device wherein the regions are each from about 1 to about 3 layers; an organic light emitting device wherein the regions are each from about 2 to about 4 layers; an organic light emitting device wherein the regions are each one layer; an organic light emitting device wherein the emitter amount is from about 0.01 to about 5 weight percent; an organic light emitting device wherein the enitter amount is from about 0.2 to about 2 weight percent; a device comprising (i) a first electrode;

(ii) a mixed region comprising a mixture of (1) a tertiary aromatic amine, (2) a metal oxinoid, and (3) a green emitting coumarin dye of the Formula

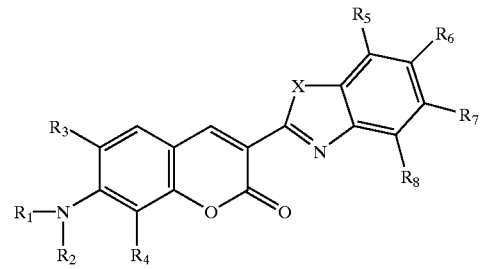

wherein X is selected from the group consisting of an oxygen atom, a sulfur atom, an alkyl imino group and an aryl imino group; $R_1$ and $R_2$ are individually selected from the group consisting of alkyl, aryl, and carbocyclic; $R_3$ and $R_4$ are individually selected from the group consisting of a hydrogen atom, alkyl, and optionally a branched or unbranched 5 or 6 member substituent ring connecting with $R_1$ and $R_2$, respectively; and $R_5$, $R_6$, $R_7$, and $R_8$ are individually selected from the group consisting of a hydrogen atom, an alkoxy group and an alkyl group;

(iii) a second electrode;

(iv) an optional thermal protective element coated on one of the first and second electrodes, wherein one of the first and second electrodes is a hole injecting anode, and one of the first and second electrodes is an electron injecting cathode, and wherein the organic light emitting device further comprises at least one of (v) a hole transport region interposed or situated between the anode and the mixed region, wherein the hole transport region optionally includes a buffer layer; and (vi) an electron transport region interposed between the cathode and the mixed region, and wherein the green emitting dye is present in an amount of from about 0.01 to about 10 weight percent based on the total of the mixed layer components (ii); and which devices possess in embodiments thereof (i) excellent, such as high stability, such as a half-life exceeding about 5,000 hours from an initial luminance of 100 cd/m² even when operated at a high temperature of about 70° C. to about 100° C.; (ii) an increased electroluminescence efficiency, amounting to, for example, in embodiments, at least 8.4 cd/A; (iii) an improved green color purity, such as, for example, color coordinates of 0.304, 0.617 on the C.I.E. chart; and/or full color display devices; an electroluminescent device (EL) comprised of (i) a first electrode like an anode;

(ii) a mixed region comprising a mixture of (1) a tertiary aromatic amine, (2) a metal oxinoid, and (3) a red emitting material as illustrated in copending application U.S. Ser. No. 10/005,404, the disclosure of which is totally incorporated herein by reference, or a green emitting coumarin dye encompassed by Formula I Formula I

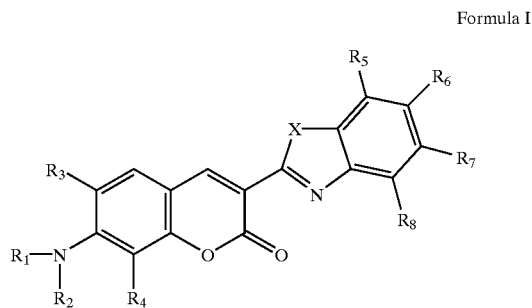

wherein X is selected from the group consisting of an oxygen atom, a sulfur atom, an alkyl imino group like $R_9$—N=, wherein $R_9$ is an alkyl group with, for example, from about 1 to about 10 carbons, and an aryl imino group like Ar—N=, wherein Ar is aryl like a phenyl group; $R_1$ and $R_2$ are individually selected from the group consisting of alkyl of, for example, from 1 to about 20 carbon atoms, aryl, and carbocyclic systems; $R_3$ and $R_4$ are individually selected from the group consisting of a hydrogen atom, alkyl of from 1 to 10 carbon atoms, and a branched or unbranched 5 or 6 member substituent ring connecting with $R_1$, $R_2$, respectively; and $R_5$, $R_6$, $R_7$, and $R_8$ are individually selected from the group consisting of a hydrogen atom; an alkoxy group of, for example, from 1 to about 10 carbon atoms; and an alkyl group of, for example, from 1 to about 20 carbon atoms; a second electrode, reference for example U.S. Pat. No. 6,020,078, the disclosure of which is totally incorporated herein by reference, (iii) an optional thermal protective element coated on at least one of the first and second electrodes, wherein one of the first and second electrodes is a hole injection anode, and one of the electrodes is an electron injection cathode, and wherein the organic light emitting device further comprises at least one of (iv) a hole transport region situated between the anode and the mixed region, wherein the hole transport region optionally includes a buffer layer; and (v) an electron transport region situated between the cathode and the mixed region, wherein region throughout refers, for example, to at least one layer, and more specifically, from 1 to about 10 layers, from 2 to about 7 layers, from 2 to about 3 layers, and the like, each layer with a thickness of, for example, from about 5 to about 5,000 nanometers.

A specific example of a green emitting compound is the coumarin dye 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T; and wherein the tertiary aromatic amine is N,N'-di(naphthalene-1-yl)-N,N'-diphenyl-benzidine (NPB) or N,N'-bis(p-biphenyl)-N,N'-diphenyl benzidine (biphenyl TPD) and the metal oxinoid is tris(8-hydroxyquinoline) aluminum ($AlQ_3$).

In each of the Figures, "region" refers to one layer, and the Figure descriptions herein refer to embodiments of the present invention, thus for example, in this appliction and related copending applications filed concurrently herewith, the regions, layers, and components thereof can possess a thickness not specifically recited and components not specifically recited.

Embodiments

Devices according to this invention possess in embodiments an improved performance in the form of a combination of desirable features, such as, for example, (i) a high stability, such as a half-life exceeding 5,000 hours from an initial luminance of 100 cd/m² even when operated at a high temperature of about 70° C. to about 100° C.; (ii) an increased electroluminescence efficiency, amounting to, for example, 8.4 cd/A; and (iii) an improved green color purity, such as, for example, color coordinates of 0.304, 0.617 on the C.I.E. chart.

The organic light emitting devices of the present invention comprise (i) an anode;

(ii) a mixed region comprising a mixture of (1) a tertiary aromatic amine, (2) a metal oxinoid, and (3) a green emitting coumarin dye of Formula I

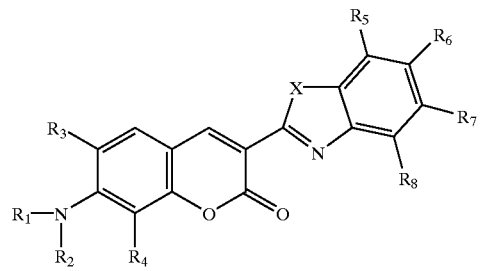

wherein the substituents, such as X and R, are as illustrated herein;

(iii) a second electrode;

(iv) a thermal protective element coated on one of the first and second electrodes, wherein one of the first and second electrodes is a hole injection anode, and one of the electrodes is an electron injection cathode, and wherein the organic light emitting device further comprises at least one of (v) a hole transport region interposed between the anode and the mixed region, wherein the hole transport region optionally includes a buffer layer; and (vi) an electron transport region interposed between the cathode and the mixed region.

The hole transport region, which can comprise a single layer or a number or plurality of layers, typically 2 or 3, laminated on each other of a thickness of from about 5 nanometers to about 5,000 nanometers, and the electron transport regions are believed to achieve a more balanced charge injection process, and reduce leakage of the carriers to the counterelectrodes (Z. D. Popovic et al., *Proceedings of the SPIE*, Vol. 3176, "Organic Light-Emitting Materials and Devices II", San Diego, Calif., Jul. 21–23, 1998, pp.

68–73, the disclosure of which is totally incorporated herein by reference), and therefore, can demonstrate higher efficiency compared to a number of organic light emitting devices of prior art, such as, for example, the organic light emitting devices of U.S. Pat. Nos. 5,853,905; 5,925,980; 6,114,055; and 6,130,001.

With further respect to the Figures, "region" refers to one layer, however, as indicated herein, region can refer to a plurality of layers.

Figure 1:
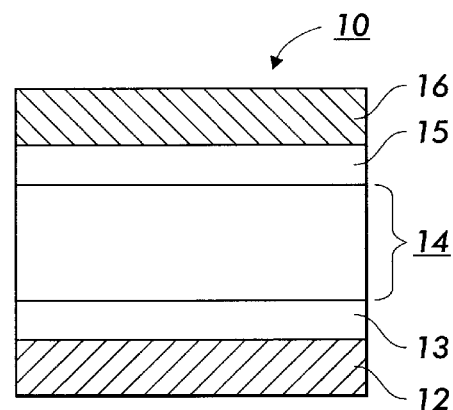
FIG. 1 illustrates an organic light emitting device.

In FIG. 1, there is illustrated an organic light emitting device 10 comprising a first electrode 12 serving as a hole injecting anode; laminated on the first electrode 12 is a hole transport region 13 which may optionally include a buffer layer; laminated on the hole transport region 13 is a mixed region 14 comprising, for example, a mixture of (1) a tertiary aromatic amine, (2) a metal oxinoid, and (3) a green emitting coumarin dye of the Formula I, such as 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T); laminated on the mixed region 14 is an electron transport region 15; and laminated on the electron transport region 15 is a second electrode 16 serving as an electron injecting electrode.

Figure 2:
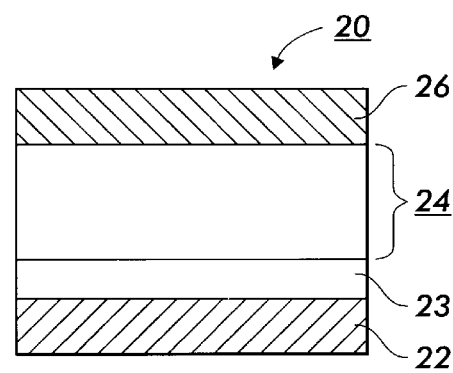
FIG. 2 illustrates another organic light emitting device.

Depending, for example, on the charge transport properties of the materials or compounds selected for the EL devices, it may be desirable in some embodiments that the organic light emitting device comprise only one of the hole transport region and the electron transport region, that is, in embodiments the device could comprise a hole transport region between the anode and the mixed region with no electron transport region between the mixed region and the cathode, and wherein the mixed region is in contact with the cathode, or an electron transport region between the mixed region and the cathode with no hole transport region between the anode and the mixed region, and wherein the mixed region is in contact with the anode. An exemplary embodiment of the aforementioned organic light emitting device is shown in FIG. 2 wherein the device 20 comprises a first electrode 22 serving as a hole injecting anode; laminated on the first electrode 22 is a hole transport region 23 which may optionally include a buffer layer; laminated on the hole transport region 23 is a mixed region 24 comprising, for example, a mixture of (1) a tertiary aromatic amine, (2) a metal oxinoid, and (3) a green emitting coumarin dye of the Formula I, such as, 10-2-(benzothiazolyl)-2,3,6,7-tetrahydro-1,1,7,7-tetramethyl-1H, 5H, 11H-(1) benzopyropyrano (6,7,-8-ij) quinolizin-11-one (C545T); and laminated on the mixed region 24 is a second electrode 26 serving as an electron injecting electrode.

Figure 3:
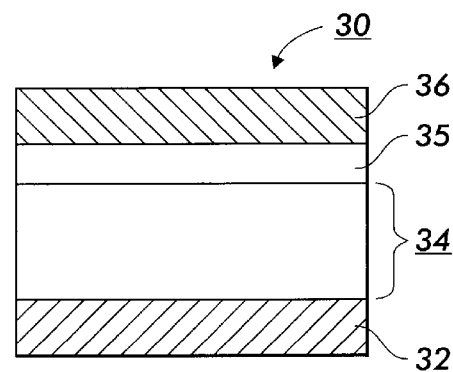
FIG. 3 illustrates yet another organic light emitting device.

With reference to FIG. 3, the organic light emitting device 30 comprises a first electrode 32 serving as a hole injecting anode; laminated on the first electrode 32 is a mixed region 34 comprising, for example, a mixture of (1) a tertiary aromatic amine, (2) a metal oxinoid, and (3) a green emitting coumarin dye of the Formula I, such as, 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T); laminated or coated on the mixed region 34 is an electron transport zone 35; and laminated on the electron transport zone is a second electrode 36 serving as an electron injecting electrode. Alternatively, the organic light emitting devices may comprise both (i) a hole transport region between the anode and the mixed region; and (ii) an electron transport region between the cathode and the mixed region, and wherein in embodiments, an optional thermal protective element, reference U.S. Ser. No. 09/770,159 and U.S. Ser. No. 09/770,154, the disclosures of which are totally incorporated herein by reference, is laminated on the first electrodes 12, 22, 32 or on the second electrodes 16, 26, 36, and wherein the organic light emitting devices comprise, for example, at least one of the hole transport regions 13, 23 between the anodes 12, 22 and the mixed regions 14, 24, and the electron transport regions 15, 35 between the mixed regions 14, 34 and the cathodes 16, 26 comprise a plurality of separate layers. The number of individual layers of the hole transport regions 13, 23 and the electron transport regions 15, 35 can be selectively varied. Typically, the number of layers of either of these regions is as illustrated herein, such as from 2 to about 10, and which device can provide a number of desirable effects, such as an improvement in the injection of the carriers into the mixed region 14, 24, 34, reduce the operating voltage and an improvement in device efficiency and/or stability.

According to embodiments of this invention, the hole transport material comprising the mixed regions 14, 24 and the hole transport material comprising the hole transport regions 13, 23 can be the same material, or different materials. As described in more detail in copending patent application U.S. Ser. No. 10/005,930, filed concurrently herewith, the use of different hole transport materials in the mixed regions 14, 24 and the hole transport regions 13, 23 can lead to desirable features, such as, for example, increase the stability of the organic light emitting devices 10, 20. In addition, the hole transport materials used in the different layers of the multiple-layer hole transport region can be different or similar.

Similarly, the electron transport material comprising the mixed regions 14, 34 and the electron transport material comprising the electron transport regions 15, 35 can be the same material, or different materials. As described in more detail in copending patent application U.S. Ser. No. 10/005, 930, filed concurrently herewith, the use of different electron transport materials in the mixed regions 14, 34 and the electron transport regions 15, 35 can lead to desirable features, such as, for example, increase the efficiency of the organic light emitting devices 10, 30. In addition, the electron transport materials used in the different layers of the multiple-layer electron transport region can be different or similar.

In embodiments, the hole transport regions 13, 23 include a layer comprising a mixture of a phthalocyanine and a hole transport material, such as, for example, a tertiary aromatic amine or an indolocarbazole. In some of these embodiments, the hole transport region is formed essentially of a layer comprising a mixture of a porphyrin, such as, for example, copper phthalocyanine (CuPc), and a hole transport material, such as for example an indolocarbazole, such as for example 5,11-di-naphthyl-5,11-dihydroindolo[3,2-b]carbazole, 2,8-dimethyl-5,11-di-naphthyl-5,11-dihydroindolo[3,2-b] carbazole; or a tertiary aromatic amine, such as for example di(naphthalene-1-yl)-N,N'-diphenyl-benzidine (NPB) or N,N'-bis(p-biphenyl)-N,N'-diphenyl benzidine (biphenyl TPD). As disclosed in more detail in copending patent application U.S. Ser. No. 10/005,970, organic light emitting devices comprising a hole transport region including a layer comprised of this mixture demonstrate a high operational stability, and more specifically, a slower increase in driving voltage of the organic light emitting devices 10, 20 during operating the device at a high temperature of about 90° C.

In embodiments of organic light emitting devices according to this invention, one of the first electrode and second electrode comprises a metal-organic mixed region including (i) a metal first component, such as for example Mg; (ii) an organic material second component, such as for example $AlQ_3$; and (iii) at least one third component selected from the group consisting of metals, organic materials and inorganic materials, such as for example Ag, as disclosed in more detail in copending patent application U.S. Ser. No. 09/800,716. In a particular embodiment, the cathode 16 of the organic light emitting device comprises a metal-organic mixed region including (i) a metal first component, such as for example Mg; (ii) an organic material second component, such as for example $AlQ_3$; and (iii) at least one third component selected from the group consisting of metals, organic materials and inorganic materials, such as for example Ag. As disclosed in more detail in copending patent application U.S. Ser. No. 09/800,716, these embodiments can result in a number of desirable properties, such as, an increased contrast, and hence a better visibility and a higher environmental stability of displays utilizing organic light emitting devices.

According to this invention, embodiments of the organic light emitting devices can be operated under alternating current (AC) and/or direct current (DC) driving conditions. AC driving conditions are preferred to provide extended operational lifetimes, especially in high temperature device operation conditions. Preferred ranges for operating voltage includes, for example, from about 3 to about 20 volts, and more specifically, from about 5 to about 15 volts. Preferred ranges for driving currents include, for example, from about 1 to about 1,000 $mA/cm^2$ density, and more specifically, from about 10 $mA/cm^2$ to about 200 $mA/cm^2$. Driving voltages and currents outside of these ranges may also be used in embodiments.

The anodes 12, 22, 32 can comprise suitable positive charge injecting electrodes, such as indium tin oxide (ITO), silicon, tin oxide, gold and platinum. Other suitable materials for the anode include, but are not limited to, electrically conductive carbon, π-conjugated polymers, such as polyaniline, polythiophene, polypyrrole, and the like, having, for example, a work function equal to, or greater than about 4 eV, and preferably from about 4 eV to about 6 eV.

The anodes 12, 22, 32 can be of any suitable form. A thin conductive layer can be coated onto a light transmissive substrate, for example, a transparent or substantially transparent glass plate or plastic film. Embodiments of the organic light emitting devices according to this invention can thus comprise a light transmissive anode formed from tin oxide or indium tin oxide (ITO) coated on a glass plate. Also, very thin light transparent metallic anodes having a thickness, for example, of less than about 200 Å, and specifically, from about 75 Å to about 150 Å can be used. These thin anodes can comprise metals such as gold, palladium and the like. In addition, transparent or semitransparent thin layers of conductive carbon or conjugated polymers, such as polyaniline, polythiophene, polypyrrole and the like, having a thickness of, for example, from 50 Å to about 175 Å can be used as anodes. Additional suitable forms of the anodes 12, 22, 32 and the cathodes 16, 26, 36 are disclosed in U.S. Pat. No. 4,885,211, the disclosure of which is totally incorporated herein by reference.

The thickness of the anodes 12, 22, 32 can range from about 1 nanometer to about 5,000 nanometers with one range depending on the optical constants of the anode material. One preferred range of thickness of the anode is from about 30 nanometers to about 300 nanometers. Thicknesses outside of these rangse can also be used.

The hole transport materials used to form the hole transport regions 13, 23 on the anodes 12, 22 can be any suitable known or later developed material. Suitable hole transport materials include, but are not limited to, conductive materials such as polyaniline and its acid-doped forms, polypyrrole, poly(phenylene vinylene), and known semiconductive organic materials; porphyrin derivatives such as 1,10,15,20-tetraphenyl-21H,23H-porphyrin copper (II) disclosed in U.S. Pat. No. 4,356,429, the disclosure of which is totally incorporated herein by reference; copper phthalocyanine, copper tetramethyl phthalocyanine; zinc phthalocyanine; titanium oxide phthalocyanine; magnesium phthalocyanine; and the like. Mixtures of these and other suitable materials can also be used. A preferred class of hole transporting materials are the aromatic tertiary amines, such as those disclosed in U.S. Pat. Nos. 4,539,507; 4,720,432 and 5,061,569, the disclosures of which are totally incorporated herein by reference. Suitable exemplary aromatic tertiary amines include, but are not limited to, bis(4-dimethylamino-2-methylphenyl)phenylmethane, N,N,N-tri (p-tolyl)amine, 1,1-bis(4-di-p-tolylaminophenyl) cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine. Other illustrative examples of tertiary aromatic amines are N,N,N',N'-tetraarylbenzidines wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N'-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Preferred hole transport materials also include N,N'-di(naphthalene-1-yl)-N,N'-diphenyl-benzidine (NPB), N,N'-bis(p-biphenyl)-N,N'-diphenyl benzidine (biphenyl TPD), and derivatives thereof.

Another class of aromatic tertiary amines selected for the hole transport region 13, 23 is the polynuclear aromatic amines. Examples of such polynuclear aromatic amines include, but are not limited to, N,N-bis-[4'-(N-phenyl-N-m-tolylamino)-4-biphenylyl]aniline; N,N-bis-[4'-(N-phenyl- N-m-tolylamino)-4-biphenylyl]-m-toluidine; N,N-bis-[4'-(N-phenyl-N-m-tolylamino)-4-biphenylyl ]-p-toluidine; N,N-bis-[4'-(N-phenyl-N-p-tolylamino)-4-biphenylyl] aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl ]-m-toluidine; N,N-bis-[4'-(N-phenyl-N-m-chlorophenylamino)-4-biphenylyl ]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like.

A further class of hole transporting materials that can be used in the hole transport regions 13, 23 is 4,4'-bis(9-carbazolyl)-1,1'-biphenyl compounds. Illustrative examples of 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like, with a preferred class of the hole transport materials being the indolocarabazoles, such as those described in U.S. Pat. Nos. 5,942,340 and 5,952,115, the disclosures of which are totally incorporated herein by reference, such as, for example 5,11-di-naphthyl-5,11-dihydroindolo[3,2-b]carbazole and 2,8-dimethyl-5,11-di-naphthyl-5,11-dihydroindolo[3,2-b] carbazole; N,N,N',N'-tetraarylbenzidines wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N'-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like.

The hole transport regions 13, 23 can further comprise an optional buffer layer comprised of a material with certain hole injection and transport properties and selected such that device performance is improved, as disclosed in more detail in copending patent application U.S. Ser. No. 09/770,159, the disclosure of which is totally incorporated herein by reference. Suitable materials that can be utilized in the buffer layer include semiconductive organic materials, such as for example, porphyrin derivatives like 1,10,15,20-tetraphenyl-21H,23H-porphyrin copper (II) disclosed in U.S. Pat. No. 4,356,429, the disclosure of which is totally incorporated herein by reference; copper phthalocyanine, copper tetramethyl phthalocyanine; zinc phthalocyanine; titanium oxide phthalocyanine; magnesium phthalocyanine; and the like, and wherein copper phthalocyanine is one preferred example. Mixtures of these and other suitable materials can also be used. Other suitable materials that can be utilized in the buffer layer include semiconductive and insulative metal compounds, such as for example metal oxides like MgO, $Al_2O_3$, BeO, BaO, AgO, SrO, SiO, $SiO_2$, $ZrO_2$, CaO, $Cs_2O$, $Rb_2O$, $Li_2O$, $K_2O$ and $Na_2O$; and metal halides like LiF, KCl, NaCl, CsCl, CsF and KF.

In specific embodiments, the hole transport regions 13, 23 include a layer comprising a mixture of a porphyrin and a hole transport material, such as, for example, a tertiary aromatic amine or an indolocarbazole. In some of these embodiments, the hole transport region is formed essentially of a layer comprising a mixture of a porphyrin, such as, for example, copper phthalocyanine (CuPc), and a hole transport material, such as for example, an indolocarbazole, or a tertiary aromatic amine, such as, for example, di(naphthalene-1-yl)-N,N'-diphenyl-benzidine (NPB) or N,N'-bis(p-biphenyl)-N,N'-diphenyl benzidine (biphenyl TPD).

The hole transport regions 13, 23 including the optional buffer layer can be prepared by forming, for example, one of the above-described materials into thin films by any suitable known or later developed method. Suitable methods for this purpose include, for example, vapor deposition and spin-coating techniques.

The optional buffer layer can be located at any position within the hole transport regions 13, 23, that is, it can be located such that one surface of the optional buffer layer coincides with one surface of the hole transport regions 13, 23; in this situation the optional buffer layer is contacting either the anodes 12, 22 or the mixed regions 14, 24, or it can be located such that the two surfaces of the buffer layer are in between the two surfaces of the hole transport regions 13, 23. However, in embodiments, the buffer layer is located in contact with the anodes 12, 22.

The hole transport regions 13, 23 including the optional buffer layer can have a thickness ranging from about 5 nanometers to about 500 nanometers with thickness outside of these ranges being possible in embodiments. The optional buffer layer can have a thickness ranging from about 1 nanometer to about 100 nanometers. In embodiments, the thickness of the optional buffer layer is at least 1 nanometer less than the thickness of the hole transport regions 13, 23. A specific thickness range for the optional buffer layer is from about 5 nanometers to about 25 nanometers; another specific thickness range for the optional buffer layer is from about 1 nanometer to about 5 nanometers.

With further respect to the buffer layer, from Z. D. Popovic et al., *Proceedings of the SPIE,* Vol. 3176, "Organic Light-Emitting Materials and Devices II," San Diego, Calif., Jul. 21-23, 1998, pp. 68–73, the disclosure of which is totally incorporated herein by reference, and U.S. application Ser. No. 09/357,551, the disclosure of which is totally incorporated herein by reference, it is known that the thickness of the hole transport region 13 may have an influence on the performance of the organic light emitting device. Also, as disclosed in greater detail in copending patent application U.S. Ser. No. 09/770,159, the disclosure of which is totally incorporated herein by reference, the thickness of the hole transport regions 13, 23 exclusive of the thickness of the optional buffer layer in the hole transport regions 13, 23 also may influence the performance of the device where, in general, reducing the thickness of the hole transport regions 13, 23 without reducing the thickness of the buffer layer in it can lead to a desirable increase in device stability and, in the same time, to an undesirable decrease in device efficiency. There is, therefore, a desirable thickness range for the hole transport regions 13, 23 for a particular thickness of the optional buffer layer in that region. A preferred thickness range for the hole transport region exclusive of the thickness of the optional buffer layer (i.e.

the remaining thickness of the hole transport region after the thickness of the buffer layer is subtracted) is from about 5 nanometers to about 15 nanometers. Another preferred thickness range for the hole transport region exclusive of the thickness of the optional buffer layer is from about 15 nanometers to about 75 nanometers. Of course, a thickness outside of these ranges can also be used.

The mixed regions 14, 24, 34 formed on the hole transport regions 13, 23 or the anode 32 comprise from about 20 weight percent to about 80 weight percent of a tertiary aromatic amine hole transport material as a first component; from about 80 weight percent to about 20 weight percent of a metal oxinoid electron transport material as a second component; and from about 0.01 weight percent to about 10 weight percent of a green emitting coumarin dye of the Formula I as a third component, where all weight percents are based on the total weight of materials comprising the mixed region. In preferred embodiments, the mixed regions 14, 24, 34 comprise and which devices in embodiments comprise, for example, from about 0.1 weight percent to about 4 weight percent of a green emitting coumarin dye of the Formula I as a third component, or wherein the amount of the green emitting coumarin dye in the mixed regions 14, 24, 34 is from about 0.2 weight percent to about 2 weight percent; and wherein the green emitting coumarin dye is, for example, 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T).

In embodiments of the organic light emitting devices according to this invention, the mixed regions 14, 24, 34 can comprise more than one layer. For example, the mixed regions 14, 4, 34 can selectively be formed to include two, three or even more separate layers. In such embodiments, the mixing ratios of the hole transport material, the electron transport material, or the green emitting coumarin dye, can be the same in each of the layers, or the mixing ratios can be varied in the layers. For example, the multiple layers can each comprise an equal weight percentage of the hole transport material and the electron transport material. In other embodiments, the mixed region can comprise different amounts of these materials.

Illustrative examples of aromatic tertiary amines that can be used in the mixed region 14, 24, 34 can be selected from those disclosed in U.S. Pat. Nos. 4,539,507; 4,720,432 and 5,061,569, the disclosures of which are totally incorporated herein by reference. Suitable exemplary aromatic tertiary amines include, but are not limited to, N,N'-di(naphthalene-1-yl)-N,N'-diphenyl-benzidine (NPB), N,N'-bis(p-biphenyl)-N,N'-diphenyl benzidine (biphenyl TPD), bis(4-dimethylamino-2-methylphenyl) phenylmethane, N,N,N-tri(p-tolyl)amine, 1,1-bis(4-di-p-tolylaminophenyl) cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, and naphthyl-substituted benzidine derivatives. Other illustrative examples of tertiary aromatic amines include N,N,N', N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N'-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Preferred hole transport materials also include the naphthyl-substituted benzidine derivatives, and mixtures thereof and the like, Illustrative examples of the metal oxinoids that can be used in is the mixed regions 14, 24, 34 include, but are not limited to, the metal oxinoid compounds as disclosed in U.S. Pat. Nos. 4,539,507; 5,151,629; 5,150,006; 5,141,671 and 5,846,666, the disclosures of which are totally incorporated herein by reference. Illustrative examples include tris(8-hydroxyquinolinate) aluminum ($Alq_3$), which is one preferred example, and bis(8-hydroxyquinolato)-(4-phenylphenolato) aluminum (BAlq), which is another specific example. Other examples of this class of materials include tris(8-hydroxyquinolinate)gallium, bis(8-hydroxyquinolinate)magnesium, bis(8-hydroxyquinolinate) zinc, tris(5-methyl-8-hydroxyquinolinate) aluminum, tris(7-propyl-8-quinolinolato)aluminum, bis[benzo{f}-8-quinolinate]zinc, bis(10-hydroxybenzo[h] quinolinate) beryllium, and the like, and metal thioxinoid compounds illustrated in U.S. Pat. No. 5,846,666, the disclosure of which is totally incorporated herein by reference, such as metal thioxinoid compounds of bis(8-quinolinethiolato)zinc, bis(8-quinolinethiolato)cadmium, tris(8-quinolinethiolato) gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials in embodiments are bis(8-quinolinethiolato)zinc, bis(8-quinolinethiolato)cadmium, tris(8-quinolinethiolato) gallium, tris(8-quinolinethiolato)indium and bis[benzo{f}-8-quinolinethiolato]zinc.

The mixed regions 14, 24, 34 can have a thickness ranging from about 10 nanometers to about 2,000 nanometers. Preferably, the mixed regions 14, 24, 34 possess a thickness of from about 50 nanometers to about 200 nanometers. As described in copending U.S. Ser. No. 09/357,551, the disclosure of which is totally incorporated herein by reference, reducing the thickness of the mixed regions 14, 24, 34 may lead to a desirable decrease in the operational voltage of the organic light emitting device, but in the same time leads to an undesirable decrease the luminance (and EL efficiency) of the organic light emitting device of this invention.

The mixed regions 14, 24, 34 can be formed by any suitable method that enables the formation of selected mixtures of the hole transport materials, electron transport materials, and the green emitting coumarin dye. For example, the mixed regions 14, 24, 34 can be formed by coevaporating the hole transport materials, electron transport materials, and the coumarin dye.

The electron transport materials used to form the electron transport regions 15, 35 on the mixed region 14, 34 can be any suitable known or later developed material. Suitable electron transport materials include, but are not limited to, conductive materials such as metal oxinoids. Illustrative examples of metal oxinoids that can be utilized in the electron transport regions 15, 35 include, but are not limited to, the metal chelates of 8-hydroxyquinoline as disclosed in U.S. Pat. Nos. 4,539,507; 5,151,629; 5,150,006 and 5,141,671, the disclosures of which are totally incorporated herein by reference. Illustrative examples include tris(8-hydroxyquinolinate) aluminum ($Alq_3$), which is a preferred electron transport material. Another preferred example is bis(8-hydroxyquinolato)-(4-phenylphenolato)aluminum (Balq). Other examples include tris(8-hydroxyquinolinate) gallium, bis(8-hydroxyquinolinate)magnesium, bis(8-hydroxyquinolinate)zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h]quinolinate)beryllium, and the like. Another preferred class of electron transport materials comprises stilbene derivatives, such as those disclosed in U.S. Pat. No. 5,516,577, the disclosure of which is totally incorporated herein by reference. A preferred stilbene derivative is 4,4'-bis(2,2-diphenylvinyl)biphenyl; specific metal thioxinoid compounds, illustrated in U.S. Pat. No. 5,846,666, the disclosure of which is totally incorporated herein by reference, like metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato)cadmium, tris(8-quinolinethiolato)gallium, tris(8-quinolinethiolato)indium and bis[benzo{f}-8-quinolinethiolato]zinc; the oxadiazole metal chelates disclosed in U.S. Pat. No. 5,925,472, the disclosure of which is totally incorporated herein by reference, like bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis[(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium, and the like; quinolines, such as, for example, 1,4-bis(4-phenylquinolin-2-yl)benzene, 4,4'-bis(4-phenylquinolin-2-yl)-1,1'-biphenyl (TA); and the triazines as described in U.S. Pat. Nos. 6,057,048 and 6,229,012, the disclosures of which are totally incorporated herein by reference, such as for example 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, 2,4,6-tris(4-biphenylyl)-1,3,5-triazine, and the like.

The electron transport regions 15, 35 can comprise an electron transport material with a thickness ranging from about 1 nanometer to about 100 nanometers. Preferably, this thickness is from about 5 nanometers to about 50 nanometers. A thickness outside of these ranges can also be used. In embodiments of organic light emitting devices comprising multiple-layered electron transport regions 15, 35, the individual layers have a thickness of at least about 1 nanometer.

The cathodes 16, 26, 36 formed on the electron transport regions 15, 35 or the mixed region 24 can comprise suitable electron injecting materials, such as metals, including high work function components, such as metals with, for example, a work function from about 4 eV to about 6 eV, or low work function components, such as metals with, for example, a work function of from about 2 eV to about 4 eV. The cathodes 16, 26, 36 can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals. The Mg—Ag alloy cathodes described in U.S. Pat. Nos. 4,885,211 and 4,720,432, the disclosures of which are totally incorporated herein by reference, are in embodiments preferred cathode materials for forming the cathodes 16, 26, 36. Other specific cathodes are described in copending patent application U.S. Ser. No. 09/800,716, and which cathodes comprise a metal-organic mixed region including (i) a metal first component, such as for example Mg; (ii) an organic material second component, such as for example AlQ$_3$; and (iii) at least one third component selected from the group consisting of metals, organic materials and inorganic materials, such as, for example Ag, and the cathodes described in U.S. Pat. No. 5,429,884, the disclosure of which is totally incorporated herein by reference. The cathodes can be formed from lithium alloys with other high work function metals such as aluminum and indium.

The cathodes 16, 26, 36 can also include an electron injection layer in contact with the electron transport regions 15, 35 or the mixed region 24 of an insulative material, such as an oxide material or an alkaline metal compound as described in U.S. Pat. Nos. 5,457,565; 5,608,287 and 5,739,635, which are each incorporated herein by reference in their entirety.

The thickness of the cathodes 16, 26, 36 can range from, for example, about 10 nanometers to about 1,000 nanometers. Thicknesses outside of this range can also be used.

In embodiments, the organic light emitting devices according to this invention comprising a thermal protective element can optionally be formed on the cathodes 16, 26, 36 or on the anodes 12, 22, 32. Examples of thermal protective components are disclosed in more detail in copending applications U.S. Ser. Nos. 09/770,159 and 09/770,154, the disclosures of which are totally incorporated herein by reference. Typically, the thermal protective element is comprised of a layer comprised of SiO, SiO$_2$ and/or mixtures thereof, and with a thickness, for example, ranging from about 300 nanometers to about 5,000 nanometers.

The following Examples are provided to further illustrate various aspects of this invention, and are not intended to limit the scope of the invention. In these Examples, "region" refers to a single layer.

EXAMPLE I

Example to Demonstrate the Higher Operational Stability at 90° C. and Improved Color Purity of Organic Light Emitting Device 10:

An organic light emitting device having a structure, such as device 10 of FIG. 1, was formed and evaluated. In this device, a naphthyl-substituted benzidine derivative N,N'-di-1-naphthyl-N,N'-diphenyl-1,1'-biphenyl-4,4'-diamine (NPB), and tris(8-hydroxyquinoline) aluminum (Alq$_3$) were used as the hole transport material and the electron transport material, respectively, comprising the hole transport region 13, the mixed region 14, and the electron transport region 15 in the organic light emitting device 10. The mixed region 14 was comprised of about 49.5 weight percent of NPB; about 49.5 weight percent of Alq$_3$; and about 1 weight percent of 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T).

Copper phthalocyanine (CuPc) was used to form a buffer layer in the hole transport region 13, with the buffer layer contacting the anode 12. The thickness of the buffer layer was about 15 nanometers; the thickness of the hole transport region 13 was about 25 nanometers; the thickness of the mixed region 14 was about 80 nanometers, and the thickness of the electron transport region 15 was about 20 nanometers. The hole transport region 13, the mixed layer 14 and the electron transport region 15 were formed between an anode 12 comprised of indium-tin-oxide (ITO) having a thickness of about 200 nanometers, precoated on a glass substrate; and a cathode 18 comprised of a Mg:Ag (10:1 by weight) alloy having a thickness of about 120 nanometers. A thermal protective element comprised of silicon monoxide (SiO) and having a thickness of about 200 nanometers was coated on the cathode 16.

The organic light emitting device was fabricated using a vacuum evaporation process at a pressure of about $6 \times 10^{-6}$ torr. The mixed region 14 was produced by coevaporation of pure (about 100 percent for pure throughout) NPB, pure Alq$_3$, and pure C545T from separate sources with the single evaporation rates being varied between about 0.1 to about 10 A/s to obtain the desired mixing ratio of the mixed region 14. Following formation of the organic hole transport region 13, the mixed region 14 and the electron transport region 15, the metal cathode 16 was deposited on the electron transport region 15 without breaking the vacuum.

The generated operational lifetime of the above EL device was tested with the device being operated at a temperature of 90° C. in nitrogen gas under AC driving conditions at an average constant current density of 31.25 mA/cm$^2$. At this current density, the initial luminance of the organic light emitting device was about 2,600 cd/m$^2$ (candela per square meter).

From operational lifetime tests, the device half-life (the time elapsed before the device luminance decreases to half the initial luminance), from an initial luminance of about 2,600 cd/m$^2$ was found to be about 500 hours for continuous device operation at a temperature of 90° C. Since the device half-life is measured at an initial luminance of about 2,600 cd/m$^2$, which is about 26 times brighter than a typical initial display luminance of 100 cd/m$^2$ under normal conditions, the measured half-life of 500 hours represents an accelerated half-life under high stressing conditions at 90° C., which corresponds to a half-life of about 13,000 hours (26×500 hours) at 90° C. under a typical initial display luminance of 100 cd/m$^2$. This Example thus demonstrates that an organic light emitting device according to embodiments of this invention can be used in applications when a device half-life of about 13,000 hours at an initial luminance of about 100 cd/m$^2$ at high temperature operation conditions, such as, for example, temperatures ranging from about 80° C. to about 100° C. or above is selected.

In contrast, the half-life of a known organic light emitting device is known to be limited to few hundred hours or less at an initial luminance of 100 cd/m$^2$, at these high, 80° C. to 100° C., temperatures, reference, for example, the EL devices of J. R. Sheats et al., "Organic Electroluminescent Devices", *Science* 273, pp. 884–888, 1996, and also S. Tokito et al., "High-Temperature Operation of an Electroluminescent Device Fabricated Using a Novel Triphenlamine Derivative", *Appl. Phys. Lett.* 69, 878 (1996). One such example of a known organic light emitting device, reference J. Shi and C. W. Tang in "Doped organic electroluminescent devices with improved stability", *Appl. Phys. Lett.* 70, pp. 1665–1667, 1997, was fabricated and evaluated. This known device comprised (1) a hole transport region about 75 nanometers thick, formed of NPB, and which included a buffer layer about 15 nanometers thick formed of CuPc contacting the anode; (2) an emitting region about 37.5 nanometers thick and formed of about 99.6 weight percent of $Alq_3$ and about 0.4 weight percent of a dimethylquinacridone (DMQ) green emitter; and (3) an electron transport region about 37.5 nanometers thick and formed of $Alq_3$ with the hole transport region, the emitting region and the electron transport region being formed between an anode comprised of indium-tin-oxide (ITO) having a thickness of about 200 nanometers, precoated on a glass substrate; and a cathode comprised of a Mg:Ag (10:1 by weight) alloy having a thickness of about 120 nanometers. This organic light emitting device was fabricated using a vacuum evaporation process at a pressure of about $6 \times 10^{-6}$ torr. The emitting electron transport region was produced by coevaporation of pure $Alq_3$ and pure DMQ from separate sources with the single evaporation rates being varied between about 0.1 to about 10 Å/s to obtain the desired mixing ratio. Following formation of the organic hole transport region and the emitting electron transport region, the metal cathode was deposited on the emitting electron transport region without breaking the vacuum.

The operational lifetime was tested with the above contrast device operated at a temperature of 90° C. in nitrogen gas under AC driving conditions at an average constant current density of 31.25 mA/cm². At this current density, the initial luminance of the organic light emitting device was about 3,000 cd/m².

From operational lifetime tests, the device half-life (the time elapsed before the device luminance decreases to half the initial luminance) from an initial luminance of about 3,000 cd/m² was found to be only about 45 hours for continuous device operation at a temperature of 90° C. Since the device half-life was measured at an initial luminance of about 3,000 cd/m², which is about 30 times brighter than a typical initial display luminance of 100 cd/m² under normal conditions, the measured half-life of 45 hours represents an accelerated half-life under high stressing conditions at 90° C., which corresponds to a half-life of only about 1,350 hours (30×45 hours) at 90° C. under a typical initial display luminance of 100 cd/m², which is a half-life of only about 10 percent of that of the above prepared device according to this invention.

The above comparison demonstrates that organic light emitting devices according to embodiments of the present invention have higher operational stability represented by a longer device half-life compared to the known unstable above contrast organic light emitting device when operated at elevated temperatures such as temperatures of from about 70° C. to about 100° C.

EXAMPLE II
Example to Demonstrate the Higher Electroluminescence Efficiency and Improved Color Purity of Organic Light Emitting Device 10:

A first organic light emitting device having a structure, such as the device 10 in FIG. 1, was formed and evaluated. In this device a naphthyl-substituted benzidine derivative N,N'-di-1-naphthyl-N,N'-diphenyl-1,1'-biphenyl-4,4'-diamine (NPB), and tris(8-hydroxyquinoline) aluminum ($Alq_3$) were used as the hole transport material and the electron transport material, respectively, comprising the hole transport region 13, the mixed region (layer throughout) 14, and the electron transport region 15 in the organic light emitting device 10. The mixed region 14 was comprised of about 49.5 weight percent of NPB; about 49.5 weight percent of $Alq_3$ and about 1 weight percent of C545T. Copper phthalocyanine (CuPc) was used to form a buffer layer in the hole transport region 13, where the buffer layer was in contact with the anode 12. The thickness of the buffer layer was about 15 nanometers, the thickness of the hole transport region 13 was about 25 nanometers, the thickness of the mixed region 14 was about 80 nanometers, and the thickness of the electron transport region 15 was about 20 nanometers. The hole transport region 13, the mixed layer 14 and the electron transport region 15 were formed between an anode 12 comprised of indium-tin-oxide (ITO) having a thickness of about 200 nanometers, precoated on a glass substrate; and a cathode 18 comprised of a Mg:Ag (10:1 by weight) alloy having a thickness of about 120 nanometers. A thermal protective element or layer comprised of silicon monoxide (SiO) and having a thickness of about 200 nanometers was coated on the cathode 16.

The organic light emitting device was fabricated using a vacuum evaporation process at a pressure of about $6 \times 10^{-6}$ torr. The mixed region 14 was produced by coevaporation of pure NPB, pure $Alq_3$, and pure C545T from separate sources with the single evaporation rates being varied between about 0.1 to about 10 Å/s to obtain the desired mixing ratio of the mixed region 14. Following formation of the organic hole transport region 13, the mixed region 14 and the electron transport region 15, the metal cathode 16 was deposited on the electron transport region 15 without breaking the vacuum.

When operated at an electric current of density equal to about 31.25 mA/cm², the above prepared organic light emitting device produced green emission with color coordinates of (0.304, 0.617) on the C.I.E. chart, and a luminance of about 2,600 cd/m², which corresponds to an electroluminescence efficiency of about 8.4 cd/A.

For comparison, a second organic light emitting device, which was in all respects identical to the first organic light emitting device except that dimethyl quinacridone (DMQ) was used instead of C545T as the green emitter in the mixed region 14 was prepared in accordance with the above process. When operated at an electric current of density equal to about 31.25 mA/cm², this second organic light emitting device produced green emission with color coordinates of about (0.377, 0.600), which corresponds to a less pure green color on the C.I.E. chart, and a luminance of only about 1,700 cd/m², which corresponds to an electroluminescence efficiency of only about 5.6 cd/A.

From the above results, the first organic light emitting device produced green luminance of improved color purity and at about 50 percent higher electroluminescence efficiency compared to the second comparison organic light emitting device. This Example thus illustrates the improved color purity and higher electroluminescence efficiency for the organic light emitting device of the present invention in embodiments in comparison to a prior art green organic light emitting device.

EXAMPLE III
Varying the Concentration of the Green Emitter Material in the Mixed Region 14:

Seven organic light emitting devices having a structure, such as the device 10 in FIG. 1, were formed and evaluated. In these devices, a naphthyl-substituted benzidine derivative N,N'-di-1-naphthyl-N,N'-diphenyl-1,1'-biphenyl-4,4'-diamine (NPB), and tris(8-hydroxyquinoline)aluminum ($Alq_3$) were used as the hole transport material and the electron transport material, respectively, comprising the hole transport 13 region, the mixed region 14, and the electron transport region 15 in the organic light emitting device 10. In the first device (device III-A), the mixed region 14 was comprised of about 49.85 weight percent of NPB; about 49.85 weight percent of $Alq_3$ and about 0.3 weight percent of C545T. In the second device (device III-B), the mixed region 14 was comprised of about 49.7 weight percent of NPB; about 49.7 weight percent of $Alq_3$ and about 0.6 weight percent of C545T. In the third device (device III-G), the mixed region 14 was comprised of about 49.6 weight percent of NPB; about 49.6 weight percent of $Alq_3$ and about 0.8 weight percent of C545T. In the fourth device (device III-D), the mixed region 14 was comprised of about 49.5 weight percent of NPB; about 49.5 weight percent of $Alq_3$ and about 1 weight percent of C545T. In the fifth device (device III-E), the mixed region 14 was comprised of about 49.4 weight percent of NPB; about 49.4 weight percent of $Alq_3$ and about 1.2 weight percent of C545T. In a sixth device (device III-F), the mixed region 14 was comprised of about 48.5 weight percent of NPB; about 48.5 weight percent of $Alq_3$ and about 3 weight percent of C545T. In a seventh device (device III-G), the mixed region 14 was comprised of about 45 weight percent of NPB; about 45 weight percent of $Alq_3$ and about 10 weight percent of C545T. In all devices, the thickness of the hole transport region 13 was about 20 nanometers, the thickness of the mixed region 14 was about 80 nanometers, and the thickness of the electron transport region 15 was about 20 nanometers. The hole transport region 13, the mixed layer 14 and the electron transport region 15 were formed between an anode 12 comprised of indium-tin-oxide (ITO) having a thickness of about 200 nanometers, precoated on a glass substrate; and a cathode 18 comprised of a Mg:Ag (10:1 by weight) alloy having a thickness of about 120 nanometers. A thermal protective element comprised of silicon monoxide (SiO) and having a thickness of about 200 nanometers was coated on the cathode 16.

The organic light emitting devices were fabricated using a vacuum evaporation process at a pressure of about $6 \times 10^{-6}$ torr. The mixed region 14 was produced by coevaporation of pure NPB, pure $Alq_3$, and pure C545T from separate sources with the single evaporation rates being varied between about 0.1 to about 10 Å/s to obtain the desired mixing ratio of the mixed region 14. Following formation of the organic hole transport region 13, the mixed region 14 and the electron transport region 15, the metal cathode 16 was deposited on the electron transport region 15 without breaking the vacuum.

When operated at an electric current of density equal to about 25 $mA/cm^2$, the above organic light emitting devices produced a green emission with color coordinates, luminance and electroluminescence efficiency as shown in Table A ($cd/m2$, candela per square meter; cd/a, candela per ampere, the color coordinates being measured etc. with a Minolta model CS 100 Chroma Meter).

TABLE A

| Device | Concentration of C545T in the Mixed Region (weight percent) | Color Coordinates | Luminance ($cd/m^2$) | Electroluminescence Efficiency (cd/A) |
|---|---|---|---|---|
| III-A | 0.3 | 0.306, 0.598 | 1590 | 6.4 |
| III-B | 0.6 | 0.304, 0.617 | 2020 | 8.1 |
| III-C | 0.8 | 0.305, 0.622 | 2100 | 8.4 |
| III-D | 1.0 | 0.305, 0.628 | 2070 | 8.3 |
| III-E | 1.2 | 0.310, 0.626 | 1600 | 6.4 |
| III-F | 3.0 | 0.321, 0.631 | 1400 | 5.6 |
| III-G | 10.0 | 0.354, 0.614 | 890 | 3.6 |

The luminance and electroluminescence efficiency of the devices changed depend on the concentration of C545T in the mixed region 14. Thus, for example, illustrated is an increase in device luminance and electroluminescence efficiency when, for example, the concentration of the C545T is, for example, from about 0.6 weight percent to about 1.2 weight percent.

EXAMPLE IV
Example to Demonstrate the Effect of Using an Electron Transport Region 15 Comprised of a Plurality of Layers on Increasing the Efficiency and Lowering the Driving Voltage of Organic Light Emitting Device 10:

A first organic light emitting device having a structure, such as the device 10 in FIG. 1, was formed and evaluated. In this device (hereafter referred to as device IV-A), a naphthyl-substituted benzidine derivative N,N'-di-1-naphthyl-N,N'-diphenyl-1,1'-biphenyl-4,4'-diamine (NPB), and tris(8-hydroxyquinoline)aluminum ($Alq_3$) were used as the hole transport material and the electron transport material, respectively, comprising the hole transport 13 region, the mixed region 14, and the electron transport region 15 in the organic light emitting device 10. The mixed region 14 was comprised of about 49.5 weight percent of NPB; about 49.5 weight percent of $Alq_3$ and about 1 weight percent of C545T. Copper phthalocyanine (CuPc) was used to form a buffer layer in the hole transport region 13 where the buffer layer was contacting the anode 12. The thickness of the buffer layer was about 15 nanometers; the thickness of the hole transport region 13 was about 25 nanometers; the thickness of the mixed region 14 was about 80 nanometers; and the thickness of the electron transport region 15 was about 20 nanometers. The hole transport region 13, the mixed layer 14 and the electron transport region 15 were formed between an anode 12 comprised of indium-tin-oxide (ITO) having a thickness of about 200 nanometers, precoated on a glass substrate; and a cathode 18 comprised of a Mg:Ag (10:1 by weight) alloy having a thickness of about 120 nanometers. A thermal protective element comprised of silicon monoxide (SiO) and having a thickness of about 200 nanometers was coated on the cathode 16. This organic light emitting device was fabricated using a vacuum evaporation process at a pressure of about $6 \times 10^{-6}$ torr. The mixed region 14 was produced by coevaporation of pure NPB, pure $Alq_3$, and pure C545T from separate sources with the single evaporation rates being varied between about 0.1 to about 10 Å/s to obtain the desired mixing ratio of the mixed region 14.

Following formation of the organic hole transport region 13, the mixed region 14 and the electron transport region 15, the metal cathode 16 was deposited on the electron transport region 15 without breaking the vacuum.

A second organic light emitting device (device IV-B) with a structure identical to device IV-A, but in which the electron transport region 15 comprised a plurality of layers of (1) a first layer (contacting the mixed region 14) formed of the same electron transport material in the mixed region 14 (i.e. Alq$_3$), about 10 nanometers thick, and (2) a second layer (contacting the cathode 16) formed of a different electron transport material (a triazine compound of 4,4'-bis-[2-(4,6-diphenyl-1,3,5-triazinyl)]-1,1'-biphenyl (T1) was used), about 10 nanometers thick, was also formed and evaluated.

A third organic light emitting device (device IV-C) with a structure identical to device IV-A, but in which the electron transport region 15 comprised a plurality of layers, which consisted of (1) a first layer (contacting the mixed region 14) formed of a different electron transport material than that used in the mixed region 14 (a quinoline compound of the form 1,4-bis(4-phenylquinolin-2-yl)benzene, 4,4'-bis(4-phenylquinolin-2-yl)-1,1'-biphenyl (TA) was used), about 10 nanometers thick, and (2) a second layer (contacting the cathode 16) formed of Alq$_3$, about 10 nanometers thick, was also formed and evaluated.

When operated at an electric current of density equal to about 25 mA/cm$^2$, the above two organic light emitting devices produced green emission at a driving voltage, luminance and electroluminescence efficiency as shown in Table B.

TABLE B

| Device | Driving Voltage (Volts) | Luminance (cd/m$^2$) | Electroluminescence Efficiency (cd/A) |
|---|---|---|---|
| IV-A | 8.2 | 2100 | 8.4 |
| IV-B | 7.9 | 2300 | 9.2 |
| IV-C | 8.8 | 2550 | 10.2 |

From Table B, devices IV-B and IV-C, which comprise an electron transport region 15 formed of a plurality of layers, demonstrate a number of desirable features, such as lower driving voltage, higher luminance and higher electroluminescence efficiency, as compared to device IV-A which comprises an electron transport region 15 of a single layer. For example, compared to device IV-A, the electroluminescence efficiency of devices IV-B and IV-C were higher by about 9.5 percent and 21 percent, respectively, and furthermore, compared to device IV-A, the power conversion efficiency of devices IV-B and IV-G were higher by about 13.7 percent and 13.2 percent, respectively. Therefore, in embodiments of organic light emitting devices according to this invention, the use of an electron transport region formed of a plurality of layers may further improve device performance. Furthermore, in these embodiments, the use of different electron transport materials in the mixed region 14 and in the electron transport region 15 at its contact with the mixed region (device IV-C) can result in a further increase in electroluminescence efficiency of the organic light emitting device. Thus, these green organic light emitting devices can be used in various room temperature conditions, such as at temperatures from about 20° C. to about 35° C. technological applications, and the high temperature (temperatures from about 70° C. to about 100° C.) operational stability of the devices enables them to be effectively used at these high temperatures and under harsh conditions. Thus, for example, the devices can be used in various types of displays such as, for example, in automobiles and other types of vehicles, computer monitors, televisions and others like electronic devices and systems. Moreover, the devices can be used in harsh conditions such as in industrial applications where high temperatures are often present. The devices in embodiments provide stable performance at high temperatures of at least, for example, about 50° C. or about 70° C. or even higher, such as about 100° C., for extended lifetimes. Thus, the organic light emitting devices according to embodiments of this invention can be used in applications in which conventional bilayer devices would not be suitable. In addition, the organic light emitting devices according to this invention can provide increased electroluminescence efficiency and embodiments increased color purity.

Other embodiments and modifications of the present invention may occur to those skilled in the art subsequent to a review of the information presented herein; these embodiments and modifications, equivalents thereof, substantial equivalents thereof, or similar equivalents thereof are also included within the scope of this invention.

What is claimed is:

1. An organic light emitting device comprising
   (i) a first electrode;
   (ii) a mixed region comprising a mixture of (1) a tertiary aromatic amine, (2) a metal oxinoid, and (3) a green emitting coumarin dye of the Formula

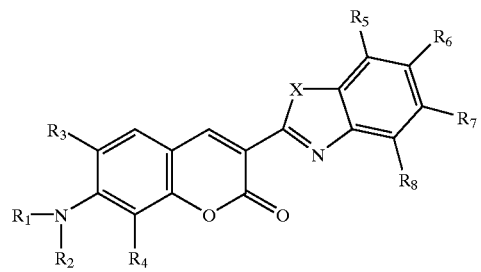

wherein X is selected from the group consisting of an oxygen atom, a sulfur atom, an alkyl imino group and aryl imino group; $R_1$ and $R_2$ are individually selected from the group consisting of alkyl, aryl, and carbocyclic; $R_3$ and $R_4$ are individually selected from the group consisting of a hydrogen atom, alkyl, and optionally a branched or unbranched 5 or 6 member substituent ring connecting with $R_1$ and $R_2$, respectively; and $R_5$, $R_6$, $R_7$, and $R_8$ are individually selected from the group consisting of a hydrogen atom, an alkoxy group and an alkyl group;
   (iii) a second electrode;
   (iv) a thermal protective element coated on one of the first and second electrodes, wherein one of the first and second electrodes is a hole injecting anode, and one of the first and second electrodes is an electron injecting cathode, and wherein the organic light emitting device further comprises at least one of
   (v) a hole transport region interposed or situated between the anode and the mixed region, wherein the hole transport region comprises a layer comprised of a mixture of (1) from about 25 weight percent to about 99 weight percent of a porphyrin; and (2) from about 75 weight percent to about 1 weight percent of an aromatic tertiary amine and/or indolocarbazoles, and optionally includes a buffer layer; and (vi) an electron transport region interposed between the cathode and the mixed region, and wherein said green emitting dye is present in an amount of from about 0.01 to about 10 weight percent based on the total of said mixed layer components (ii).

2. An organic light emitting device in accordance with claim 1 wherein the green emitting coumarin dye is 10-2-(benzothiazolyl)-2,3,6,7-tetrahydro-1,1,7,7-tetramethyl-1H,5H, 11H-(1)benzopyropyrano (6,7,-8-ij) quinolizin-11-one (C545T).

3. An organic light emitting device in accordance with claim 1 wherein the tertiary aromatic amine is a N,N,N',N'-tetraaryl benzidine.

4. An organic light emitting device in accordance with claim 1 wherein the amine is an N,N,N',N'-tetraaryl benzidine selected from the group consisting of N,N'-di(naphthalene-1-yl)-N,N'-diphenyl-benzidine (NPB) and N,N'-bis(p-biphenyl)-N,N'-diphenyl benzidine (biphenyl TPD), and the metal oxinoid is tris(8-hydroxyquinoline) aluminum ($Alq_3$).

5. An organic light emitting device in accordance with claim 1 wherein there is at least one of (1) said hole transport region comprises at least one material selected from the group consisting of tertiary aromatic amines, porphyrins, and indolocarbazoles; or (2) said electron transport region comprises at least one material selected from the group consisting of metal oxinoids, stilbenes, triazines, porphyrins, and quinolines.

6. An organic light emitting device in accordance with claim 1 wherein the mixed region comprises from about 20 weight percent to about 80 weight percent of a tertiary aromatic amine; from about 80 weight percent to about 20 weight percent of the metal oxinoid; and from about 0.1 weight percent to about 5 weight percent of the coumarin dye, and wherein the weight percents are based on the total weight of materials comprising the mixed region.

7. An organic light emitting device in accordance with claim 1 wherein the mixed region comprises from about 35 weight percent to about 65 weight percent of the tertiary aromatic amine; from about 65 weight percent to about 35 weight percent of the metal oxinoid; and from about 0.1 weight percent to about 4 weight percent of the coumarin dye, and wherein the weight percents are based on the total weight of materials comprising the mixed region.

8. An organic light emitting device in accordance with claim 1 wherein the mixed region comprises from about 0.2 weight percent to about 2 weight percent of the coumarin dye, and wherein the weight percentages are based on the total weight of materials comprising the mixed region.

9. An organic light emitting device in accordance with claim 1 wherein there is at least one of A. the material comprising the hole transport region and the tertiary aromatic amine comprising the mixed region are similar, and B. the material comprising the electron transport region and the metal oxinoid comprising the mixed region are similar.

10. An organic light emitting device in accordance with claim 1 wherein there is at least one of A. the material comprising the hole transport region and the tertiary aromatic amine comprising the mixed region are different materials, and B. the material comprising the electron transport region and the metal oxinoid comprising the mixed region are different materials.

11. An organic light emitting device in accordance with claim 1 wherein there is an electron transport region, and wherein the electron transport region comprises at least two layers.

12. An organic light emitting device in accordance with claim 11 wherein (1) a first layer of the electron transport region is contacting the mixed region, and which first layer comprises a material selected from the group consisting of metal oxinoids and quinolines; and (2) a second layer of the electron transport region is contacting the cathode, and which second layer comprises a material selected from the group consisting of metal oxinoids, phthalocyanines, and triazines.

13. An organic light emitting device in accordance with claim 12 wherein the first layer comprises a metal oxinoid comprising tris(8-hydroxyquinoline)aluminum ($Alq_3$) or bis(8-hydroxyquinolato)-(4-phenylphenolato)aluminum (Balq), or a quinoline of 1,4-bis(4-phenylquinolin-2-yl)benzene, 4,4'-bis(4-phenylquinolin-2-yl)-1,1'-biphenyl (TA); and the second layer comprises a metal oxinoid of tris(8-hydroxyquinoline)aluminum ($Alq_3$) or bis(8-hydroxyquinolato)-(4-phenylphenolato)aluminum (Balq); a phthalocyanine of copper phthalocyanine (CuPc); or a triazine of 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine.

14. An organic light emitting device in accordance with claim 1 wherein there is a hole transport region, and wherein the hole transport region comprises at least two layers.

15. An organic light emitting device in accordance with claim 14 wherein (1) a first layer of the hole transport region is contacting the anode, and which first layer comprises a porphyrin; and (2) a second layer of the hole transport region is contacting the mixed region, and which second layer comprises a material selected from the group consisting of tertiary aromatic amines and indolocarbazoles.

16. An organic light emitting device in accordance with claim 15 wherein the first layer comprises copper phthalocyanine; and the second layer comprises a tertiary aromatic amine of N,N'-di(naphthalene-1-yl)-N,N'-diphenyl-benzidine (NPB) or N,N'-bis(p-biphenyl)-N,N'-diphenyl benzidine (biphenyl TPD); or an indolocarbazole comprising 5,11-di-naphthyl-5,11-dihydroindolo[3,2-b]carbazole, or 2,8-dimethyl-5,11-di-naphthyl-5,11-dihydroindolo[3,2-b]carbazole.

17. An organic light emitting device in accordance with claim 1 wherein there is at least one of (1) an anode comprising a layer of indium-tin-oxide, and (2) a cathode comprising a layer selected from the group consisting of (a) Mg and Ag; (b) Al; (c) indium-tin-oxide; and (d) an organic compound, Mg and Ag.

18. An organic light emitting device in accordance with claim 17 wherein the cathode further comprises an alkaline metal or a compound thereof.

19. An organic light emitting device in accordance with claim 18 wherein the alkaline metal is selected from the group consisting of Li, Na, K and Cs.

20. An organic light emitting device in accordance with claim 1 wherein there is a thermal protective element, or layer present, and which thermal protective element comprises a layer of SiO, SiO$_2$ or mixtures thereof.

21. An organic light emitting device in accordance with claim 1 wherein the mixed region has a thickness of from about 5 nanometers to about 500 nanometers; the hole transport region has a thickness of from about 5 nanometers to about 250 nanometers; and/or the electron transport region has a thickness of from about 5 nanometers to about 100 nanometers.

22. An organic light emitting device in accordance with claim 1 and comprising (a) an anode of indium-tin-oxide with thickness of from about 30 to about 300 nanometers coated on a substrate, the anode and the substrate being capable of transmitting at least about 70 percent of radiation of wavelength longer than about 400 nanometers;

(b) a hole transport region on the anode comprised of at least one material selected from the group of materials including copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;

(c) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris(8-hydroxyquinoline) aluminum or bis(8-hydroxyquinolato)-(4-phenylphenolato)aluminum; and (3) from about 0.2 weight percent to about 2 weight percent of 10-2-(benzothiazolyl)-2,3,6,7-tetrahydro-1,1,7,7-tetramethyl-1H, 5H, 11H-(1)benzopyropyrano(6,7,-8-ij) quinolizin-11-one (C545T), wherein all weight percents are based on the total weight of materials comprising the mixed region, and wherein the thickness of the mixed region is from about 50 nanometers to about 150 nanometers;

(d) an electron transport region situated on the mixed region comprised of tris(8-hydroxyquinoline) aluminum (Alq$_3$) or bis(8-hydroxyquinolato)-(4-phenylphenolato)aluminum (Balq), wherein the thickness of the electron transport region is from about 5 nanometers to about 50 nanometers;

(e) a cathode situated on the electron transport region comprised of one of (1) a layer comprised of Mg:Ag alloy or Al of a thickness of from about 50 nanometers to about 500 nanometers; or (2) a first layer comprised of from about 40 volume percent to about 55 volume percent of Mg; from about 2 volume percent to about 10 volume percent of Ag and from about 55 volume percent to about 40 volume percent of Alq$_3$, wherein the thickness of the first layer is from about 100 nanometers to about 600 nanometers, and coated with a second layer of thickness from about 50 nanometers to about 500 nanometers and comprising a metal or a metal alloy; and (f) a thermal protective element situated on the cathode comprised of SiO, SiO$_2$ or mixtures thereof of a thickness of from about 100 nanometers to about 1,000 nanometers.

23. An organic light emitting device in accordance with claim 1 and comprising (a) an anode of indium-tin-oxide with thickness of from about 30 to about 300 nanometers coated on a substrate, the anode and the substrate being capable of transmitting at least 70 percent of radiation of wavelength longer than 400 nanometers;

(b) a hole transport region on or in contact with the anode comprised of at least one material selected from the group of materials including N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region further comprises a buffer layer contacting the anode, and comprised of copper phthalocyanine wherein the thickness of the buffer layer is from about 10 nanometers to about 30 nanometers, and the thickness of the hole transport region is from about 5 nanometers to about 20 nanometers greater than the thickness of the buffer layer;

(c) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris(8-hydroxyquinoline) aluminum or bis(8-hydroxyquinolato)-(4-phenylphenolato)aluminum; and (3) from about 0.2 weight percent to about 2 weight percent of 10-2-(benzothiazolyl)-2,3,6,7-tetrahydro-1,1,7,7-tetramethyl-1H, 5H, 11H-(1)benzopyropyrano(6,7,-8-ij) quinolizin-11-one (C545T), wherein all weight percents are based on the total weight of materials comprising the mixed region, and wherein the thickness of the mixed region is from about 50 nanometers to about 150 nanometers;

(d) an electron transport region situated on the mixed region comprised of tris(8-hydroxyquinoline) aluminum (Alq$_3$) or bis(8-hydroxyquinolato)-(4-phenylphenolato)aluminum (Balq), wherein the thickness of the electron transport region is from about 5 nanometers to about 50 nanometers;

(e) a cathode situated on the electron transport region comprised of one of (1) a layer comprised of Mg:Ag alloy or Al of a thickness of from about 50 nanometers to about 500 nanometers; or (2) a first layer comprised of from about 40 volume percent to about 55 volume percent of Mg; from about 2 volume percent to about 10 volume percent of Ag and from about 55 volume percent to about 40 volume percent of Alq$_3$, wherein the thickness of the first layer is from about 100 nanometers to about 600 nanometers; and coated with a second layer of a thickness from about 50 nanometers to about 500 nanometers comprising a metal or a metal alloy; and (f) an optional thermal protective element situated on the cathode comprised of SiO, SiO$_2$ or mixtures thereof of a thickness of from about 100 nanometers to about 1,000 nanometers.

24. An organic light emitting device in accordance with claim 1 and comprising (a) an anode of indium-tin-oxide with a thickness of from about 30 to about 300 nanometers coated on a substrate, the anode and the substrate being capable of transmitting at least 70 percent of radiation of wavelength longer than 400 nanometers;

(b) a hole transport region on the anode comprised of at least one material selected from the group of materials consisting of copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 2,8-dimethyl-5,11-di-naphthyl-5,11-dihydroindolo[3,2-b]carbazole; and which region has a thickness of from about 5 nanometers to about 100 nanometers;

(c) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris(8-hydroxyquinoline) aluminum or bis(8-hydroxyquinolato)-(4-phenylphenolato)aluminum; and (3) from about 0.2 weight percent to about 2 weight percent of 10-2-(benzothiazolyl)-2,3,6,7-tetrahydro-1,1,7,7-tetramethyl-1H, 5H, 11H-(1)benzopyropyrano(6,7,-8-ij) quinolizin-11-one (C545T), wherein all weight percents are based on the total weight of materials comprising the mixed region, and wherein the thickness of the mixed region is from about 50 nanometers to about 150 nanometers;

(d) an electron transport region situated on the mixed region comprising (1) a first layer of a thickness of from about 5 nanometers to about 25 nanometers contacting the mixed region, wherein this first layer is comprised of tris(8-hydroxyquinoline)aluminum ($Alq_3$), bis(8-hydroxyquinolato)-(4-phenylphenolato)aluminum (Balq), or 1,4-bis(4-phenylquinolin-2-yl)benzene, 4,4'-bis(4-phenylquinolin-2-yl)-1,1'-biphenyl (TA); and (2) a second layer of a thickness of from about 5 nanometers to about 25 nanometers contacting the cathode, wherein the second is comprised of tris(8-hydroxyquinoline)aluminum ($Alq_3$), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine;

(e) a cathode situated on the electron transport region comprised of one of (1) a layer comprised of Mg:Ag alloy or Al of a thickness of from about 50 nanometers to about 500 nanometers; or (2) a first layer comprised of from about 40 volume percent to about 55 volume percent of Mg; from about 2 volume percent to about 10 volume percent of Ag and from about 55 volume percent to about 40 volume percent of $Alq_3$, wherein the thickness of the first layer is from about 100 nanometers to about 600 nanometers; and coated with a second layer of a thickness of from about 50 nanometers to about 500 nanometers comprising a metal or a metal alloy; and (f) a thermal protective element situated on the cathode comprised of SiO, $SiO_2$ or mixtures thereof of a thickness of from about 100 nanometers to about 1,000 nanometers.

25. An organic light emitting device in accordance with claim 1 and comprising (a) an anode of indium-tin-oxide with a thickness of from about 30 to about 300 nanometers coated on a substrate, the anode and the substrate being capable of transmitting at least 70 percent of radiation of wavelength longer than 400 nanometers;

(b) a hole transport region on the anode comprised of a material selected from the group of materials including N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole, and 8-dimethyl-5,11-di-naphthyl-5,11-dihydroindolo[3,2-b]carbazole; and which region further comprises a buffer layer contacting the anode and comprised of copper phthalocyanine, wherein the thickness of the buffer layer is from about 10 nanometers to about 30 nanometers, and the thickness of the hole transport region is from about 5 nanometers to about 20 nanometers greater than the thickness of the buffer layer;

(c) a mixed region situated on the hole transport region comprised of (1) from about 35 weight percent to about 65 weight percent of N,N'-di(naphthalene-1-yl)-N,N'-diphenyl-benzidine (NPB) or N,N'-bis(p-biphenyl)-N,N'-diphenyl benzidine (biphenyl TPD); (2) from about 65 weight percent to about 35 weight percent of tris(8-hydroxyquinoline) aluminum or bis(8-hydroxyquinolato)-(4-phenylphenolato)aluminum; and (3) from about 0.2 weight percent to about 2 weight percent of 10-2-(benzothiazolyl)-2,3,6,7-tetrahydro-1,1,7,7-tetramethyl-1H, 5H, 11H-(1)benzopyropyrano(6,7,-8-ij) quinolizin-11-one (C545T), wherein all weight percents are based on the total weight of materials comprising the mixed region, and wherein the thickness of the mixed region is from about 50 nanometers to about 160 nanometers;

(d) an electron transport region situated on the mixed region comprising (1) a first layer of a thickness of from about 5 nanometers to about 25 nanometers contacting the mixed region, wherein this first layer is comprised of tris(8-hydroxyquinoline)aluminum ($Alq_8$), bis(8-hydroxyquinolato)-(4-phenylphenolato)aluminum (Balq), 1,4-bis(4-phenylquinolin-2-yl)benzene, or 4,4'-bis(4-phenylquinolin-2-yl)-1,1'-biphenyl (TA); and (2) a second layer of a thickness of from about 5 nanometers to about 25 nanometers contacting the cathode, wherein the second is comprised of tris(8-hydroxyquinoline)aluminum ($Alq_3$), bis(8-hydroxyquinolato)-(4-phenylphenolato)aluminum (Balq), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, or 2,4,6-tris(4-biphenylyl)-1,3,5-triazine;

(e) a cathode situated on the electron transport region comprised of one of (1) a layer comprising of Mg:Ag alloy or Al of a thickness of from about 50 nanometers to about 500 nanometers; or (2) a first layer comprised of from about 40 volume percent to about 55 volume percent of Mg; from about 2 volume percent to about 10 volume percent of Ag and from about 55 volume percent to about 40 volume percent of $Alq_3$, wherein the thickness of the first layer is from about 100 nanometers to about 600 nanometers, and coated with a second layer of a thickness of from about 50 nanometers to about 500 nanometers comprising a metal or a metal alloy; and (f) an optional thermal protective element situated on the cathode comprised of SiO, $SiO_2$ or mixtures thereof of a thickness of from about 100 nanometers to about 1,000 nanometers.

26. A display comprising at least one organic light emitting device of claim 1.

27. An organic light emitting device in accordance with claim 1 wherein X is oxygen or sulfur.

28. An organic light emitting device in accordance with claim 1 wherein X is an alkyl amino group wherein alkyl contains from about 1 to about 20 carbon atoms.

29. An organic light emitting device in accordance with claim 1 wherein X is an aryl imino group wherein aryl contains from about 6 to about 36 carbon atoms.

30. An organic light emitting device in accordance with claim 1 wherein $R_1$ and $R_2$ alkyl contain from about 1 to about 20 carbon atoms, and $R_1$ and $R_2$ aryl contain from about 6 to about 36 carbon atoms.

31. An organic light emitting device in accordance with claim 1 wherein $R_3$ and $R_4$ alkyl contain from about 1 to about 20 carbon atoms.

32. An organic light emitting device in accordance with claim 1 wherein $R_5$, $R_6$, $R_7$ and $R_8$ alkoxy contain from about 1 to about 20 carbon atoms, and alkyl contains from about 1 to about 20 carbon atoms.

33. An organic light emitting device in accordance with claim 1 wherein said protective layer is comprised of a silicon dioxide or a silicon oxide.

34. An organic light emitting device in accordance with claim 1 wherein said hole transport region is present; said electron transport region is present; or said hole transport region and said electron transport region are present.

35. An organic light emitting device in accordance with claim 1 wherein said regions comprise from about 1 to about 20 layers.

36. An organic light emitting device in accordance with claim 1 wherein said regions comprise from about 1 to about 5 layers.

37. An organic light emitting device in accordance with claim 1 wherein said regions are each from about 1 to about 3 layers.

38. An organic light emitting device in accordance with claim 1 wherein said regions are each from about 2 to about 4 layers.

39. An organic light emitting device in accordance with claim 1 wherein said regions are each one layer.

40. An organic light emitting device in accordance with claim 1 wherein said emitter amount is from about 0.01 to about 5 weight percent.

41. An organic light emitting device in accordance with claim 1 wherein said emitter amount is from about 0.2 to about 2 weight percent.

42. A device comprising (i) a first electrode;

(ii) a mixed region comprising a mixture of (1) a tertiary aromatic amine, (2) a metal oxinoid, and (3) a green emitting coumarin dye of the Formula

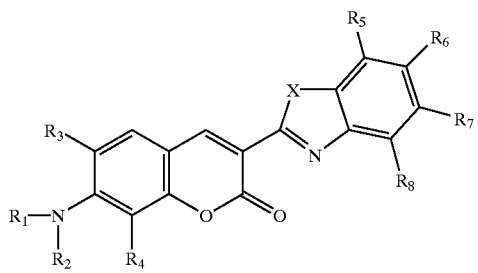

wherein X is selected from the group consisting of an oxygen atom, a sulfur atom, an alkyl imino group and an aryl imino group; $R_1$ and $R_2$ are individually selected from the group consisting of alkyl, aryl, and carbocyclic; $R_3$ and $R_4$ are individually selected from the group consisting of a hydrogen atom, alkyl, and optionally a branched or unbranched 5 or 6 member substituent ring connecting with $R_1$ and $R_2$, respectively; and $R_5$, $R_6$, $R_7$, and $R_8$ are individually selected from the group consisting of a hydrogen atom, an alkoxy group and an alkyl group;

(iii) a second electrode;

(iv) a thermal protective element coated on one of the first and second electrodes, wherein one of the first and second electrodes is a hole injecting anode, and one of the first and second electrodes is an electron injecting cathode, and wherein the organic light emitting device further comprises at least one of (v) a hole transport region interposed or situated between the anode and the mixed region, wherein the hole transport region comprises a layer comprised of a mixture of (1) from about 25 weight percent to about 99 weight percent of a porphyrin; and (2) from about 75 weight percent to about 1 weight percent of an aromatic tertiary amine and/or indolocarbazoles and optionally includes a buffer layer; and (vi) an electron transport region interposed between the cathode and the mixed region, and wherein said green emitting dye is present in an amount of from about 0.01 to about 10 weight percent based on the total of said mixed layer components (ii).

* * * * *